(12) United States Patent
Emi et al.

(10) Patent No.: US 7,669,174 B2
(45) Date of Patent: Feb. 23, 2010

(54) PATTERN GENERATION METHOD AND CHARGED PARTICLE BEAM WRITING APPARATUS

(75) Inventors: Keiko Emi, Ibaraki (JP); Junichi Suzuki, Saitama (JP); Takayuki Abe, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 376 days.

(21) Appl. No.: 11/671,243

(22) Filed: Feb. 5, 2007

(65) Prior Publication Data

US 2007/0192757 A1 Aug. 16, 2007

(30) Foreign Application Priority Data

Feb. 14, 2006 (JP) .............................. 2006-036640
Sep. 28, 2006 (JP) .............................. 2006-263817

(51) Int. Cl.
*G06F 17/50* (2006.01)
*G06F 19/00* (2006.01)
*G21K 5/00* (2006.01)
*G03F 1/00* (2006.01)

(52) U.S. Cl. ................... 716/20; 716/7; 430/5; 378/35; 250/492.3; 700/121; 703/1; 703/6

(58) Field of Classification Search .................. 716/20, 716/7; 430/5; 378/35; 250/492.2; 703/1, 703/6; 345/423; 700/121
See application file for complete search history.

(56) References Cited

U.S. PATENT DOCUMENTS

| 4,941,114 | A | * | 7/1990 | Shigyo et al. ................. 716/20 |
| 5,241,185 | A |   | 8/1993 | Meiri et al. |
| 5,615,318 | A | * | 3/1997 | Matsuura .................... 345/420 |
| 5,948,573 | A | * | 9/1999 | Takahashi ..................... 430/5 |
| 6,503,671 | B1 |  | 1/2003 | Nakajima |
| 6,815,693 | B2 |  | 11/2004 | Kamijo et al. |
| 6,845,497 | B2 |  | 1/2005 | Murai et al. |
| 2005/0221200 | A1 | * | 10/2005 | Chen ............................ 430/5 |
| 2005/0237320 | A1 | * | 10/2005 | Itoh et al. ................... 345/418 |

(Continued)

FOREIGN PATENT DOCUMENTS

JP  2004-48018  2/2004

(Continued)

OTHER PUBLICATIONS

U.S. Appl. No. 11/460,848, filed Jul. 28, 2006, Keiki Emi, et al.

(Continued)

*Primary Examiner*—Phallaka Kik
(74) *Attorney, Agent, or Firm*—Oblon, Spivak, McClelland, Maier & Neustadt, L.L.P.

(57) ABSTRACT

A pattern generation method includes changing a dimension of a pattern included in each mesh-like region of a plurality of mesh-like regions by using an area of the pattern and a total sum of lengths of circumferential sides of the pattern included in each mesh-like region to correct a dimension error of the pattern, wherein the dimension error being caused by loading effects and the plurality of mesh-like regions being virtually divided from a pattern forming region of a target object, and generating a pattern of the dimension changed on the target object.

11 Claims, 18 Drawing Sheets

U.S. PATENT DOCUMENTS

2005/0263722 A1* 12/2005 Marrian et al. ......... 250/492.22
2007/0192757 A1    8/2007  Emi et al.
2008/0206654 A1    8/2008  Abe

FOREIGN PATENT DOCUMENTS

JP       2005-195787       7/2005
KR       1998-071574       10/1998

OTHER PUBLICATIONS

U.S. Appl. No. 11/535,725, filed Sep. 27, 2006, Junichi Suzuki, et al.

Emile Sahouria, et al., "Pattern based mask process correction—impact on data quality and mask writing time", Proceedings of SPIE vol. 5853, 2005, pp. 564-573.

Jens Schneider, et al., "Compensation of long-range process effects on photomasks by design data correction", Proceedings of SPIE vol. 4889, 2002, pp. 59-66.

* cited by examiner

PATTERN GENERATION METHOD AND CHARGED PARTICLE BEAM WRITING APPARATUS

CROSS-REFERENCE TO RELATED APPLICATION

This application is based upon and claims the benefit of priority from the prior Japanese Patent Application No. 2006-036640 filed on Feb. 14, 2006 in Japan, and the prior Japanese Patent Application No. 2006-263817 filed on Sep. 28, 2006 in Japan, the entire contents of which are incorporated herein by reference.

BACKGROUND OF THE INVENTION

1. Field of the Invention

The present invention relates to a pattern generation method and a charged particle beam writing apparatus, for example, a method of correcting a variable in pattern dimension caused by loading effects in pattern formation after electron beam writing to form a pattern on a target object and a writing apparatus and method for writing a pattern by using an electron beam on the target object.

2. Related Art

A lithography technique which leads development of micro patterning of semiconductor devices is a very important process which uniquely generates a pattern in semiconductor manufacturing processes. In recent years, with high integration of an LSI, a circuit line width required for semiconductor devices progressively decreases year after year. In order to form a desired circuit pattern on the semiconductor devices, a high-definition original pattern (also called a reticle or a mask) is necessary. In this case, an electron beam writing technique has an essentially excellent resolution and is used in production of a high-definition original pattern.

FIG. 17 is a conceptual diagram for explaining an operation of a conventional electron beam writing apparatus.

A variable-shaped electron beam (EB) writing apparatus operates as follows. In a first aperture 410, a square, for example, rectangular opening 411 to shape an electron beam 330 is formed. In a second aperture 420, a variable-shaped opening 421 to shape the electron beam 330 having passed through the opening 411 in a desired square shape is formed. The electron beam 330 irradiated from a charged particle source 430 and having passed through the opening 411 is deflected by a deflector. The electron beam 330 passes through a part of the variable-shaped opening 421 and is irradiated on a target object 340 placed on a stage. The stage continuously moves in one predetermined direction (for example, defined as an X direction). More specifically, a square shape which can pass through both the opening 411 and the variable-shaped opening 421 is written in a writing region of the target object 340. A scheme which causes an electron beam to pass through both the opening 411 and the variable-shaped opening 421 to form an arbitrary shape is called a variable shaped beam (VSB) scheme.

In the electron beam writing described above, a line width in a higher definition target object plane, for example, in a mask plane is required to be uniformed. In the electron beam writing, a phenomenon called a proximity effect disadvantageously occurs when an electron beam is irradiated on a mask to which a resist is applied to write a circuit pattern. This phenomenon is called a proximity effect caused by back scattering in which an electron passes through a resist layer, reaches a layer under the resist layer, and is incident on the resist layer again. For this reason, in writing, a variation in dimension occurs, i.e., a pattern is written in a dimension varying from a desired dimension.

On the other hand, furthermore, when a resist film is developed after writing or a film under the resist film is etched, a variation in dimension called loading effects caused by an area density of line segments of a circuit pattern disadvantageously occurs.

As a technique which corrects the proximity effect or the loading effects, the following description about the following contents is disclosed (for example, see Published Unexamined Japanese Patent Application No. 2005-195787 (JP-A-2005-195787)). In this case, an entire circuit pattern is divided in a 500-μm-square global loading effect small zone, a 0.5-μm-square proximity effect small zone, and a 50-nm-square micro-loading effect small zone. A map of influence quantity is formed. By using a dose (fixed value) at which a circuit pattern having a predetermined area density of 50% can be appropriately written, an exposure dose to write the circuit pattern is calculated. In this calculation, a proximity effect influenceability map and a map of proximity effect correction coefficients η calculated from a loading effect correction amount are used.

As described above, in charged particle beam writing typified by electron beam writing, a variation in dimension called loading effects occurs. As the loading effects, for example, a development loading effect of a resist film is given, or a Cr-loading effect occurring in etching of chromium (Cr) serving as a light-shielding film under the resist film is given. Furthermore, a loading effect or the like caused by a variation in pattern dimension in chemical mechanical polishing (CMP) is posed. On the other hand, in electron beam writing, a line width in a higher definition mask plane is required to be uniformed with a decrease in pattern line width. For this reason, loading effect correction which corrects a variation in dimension caused by the loading effects is performed. In this correction, a pattern is written in a state in which correction is performed at an amount of pattern dimension correction calculated to allow an amount of variation in dimension due to the loading effects in advance from a design line width of a circuit pattern (design pattern) A desired design line width can be obtained through loading effects caused by etching or the like. For example, when a calculated variation in dimension caused by the loading effects positively varies (to increase a line width), a circuit pattern is corrected in advance and then irradiated such that a line width is smaller than a design line width by the variation in dimension caused by the loading effects.

However, when a pattern is written with a line width smaller than a design line width, an area density (pattern density) of a circuit pattern obtained after the pattern writing is smaller than an area density (pattern density) of an original design pattern. For this reason, loading effects caused by etching or the like performed thereafter also decrease.

FIG. 18 is a diagram showing an example of a design pattern.

FIG. 19 is a diagram showing an example of a writing pattern obtained when the design pattern in FIG. 18 is written.

FIG. 20 is a conceptual diagram for explaining a line width of a pattern which is actually completed after etching when writing is performed with the dimension in FIG. 19.

When a pattern line width of an original design pattern 22 on a target object 20 such as a mask is given by $CD_0$, a writing pattern 24 having a line width $CD_d(=CD_0-2L)$ smaller than the pattern line width $CD_0$ by an amount of variation in dimension L obtained by loading effects is written. However, as described above, the loading effects caused by etching or the like after the writing as described above become small.

For this reason, an amount of variation in dimension L' caused by actual positive loading effects also becomes small. As a result, a line width $CD_f$ of an actual circuit pattern 26 completed through an etching step is smaller than an expected design value (pattern line width $CD_0$ of the design pattern 22). Consequently, a correction residual (L−L') is disadvantageously generated.

BRIEF SUMMARY OF THE INVENTION

It is, therefore, an object of the present invention to provide a pattern generation method and apparatus for reducing a correction residual in loading effect correction.

In accordance with one aspect of this invention, a pattern generation method includes changing a dimension, or "size" of a pattern included in each mesh-like region of a plurality of mesh-like regions by using an area of the pattern and a total sum of lengths of circumferential sides of the pattern included in each mesh-like region to correct a dimension error of the pattern, wherein the dimension error being caused by loading effects and the plurality of mesh-like regions being virtually divided from a pattern forming region of a target object, and generating, or "forming" a pattern of the dimension changed on the target object.

In accordance with another aspect of the invention, a pattern generation method includes changing a exposure dose of a charged particle beam by using an area of a pattern included in each mesh-like region of a plurality of mesh-like regions and a total sum of lengths of circumferential sides of the pattern to correct a dimension error of the pattern, wherein the dimension error being caused by loading effects and the plurality of mesh-like regions being virtually divided from a pattern forming region of a target object, and irradiating a charged particle beam at the exposure dose changed to form the pattern on the target object.

Further, in accordance with another aspect of the invention, a charged particle beam writing apparatus includes a correcting unit configured to correct a exposure dose of a charged particle beam by using an area of a pattern included in each mesh-like region of a plurality of mesh-like regions and a total sum of lengths of circumferential sides of the pattern, wherein the plurality of mesh-like regions being virtually divided from a pattern forming region of a target object, and a pattern writing unit configured to write the pattern onto the target object by irradiating the charged particle beam at the corrected exposure dose.

DETAILED DESCRIPTION OF THE INVENTION

In respective embodiments, a configuration using an electron beam will be described below as an example of a charged particle beam. The charged particle beam is not limited to the electron beam, and beam such as an ion beam using other charged particles may be used.

First Embodiment

Figure 1:
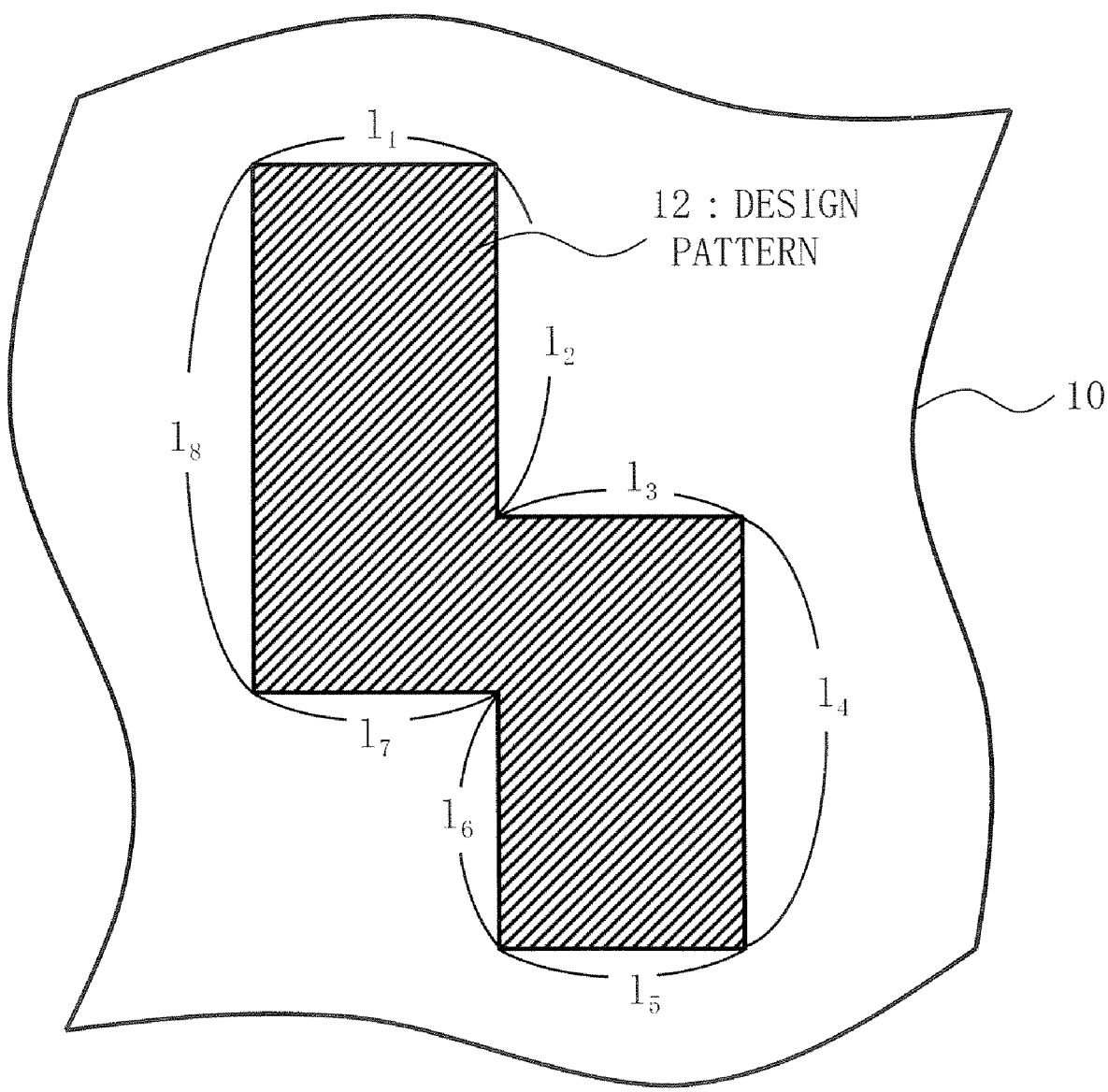
FIG. 1 is a diagram showing an example of a design pattern formed in a first embodiment.

FIG. 1 is a diagram showing an example of a design pattern formed in a first embodiment.

Figure 2:
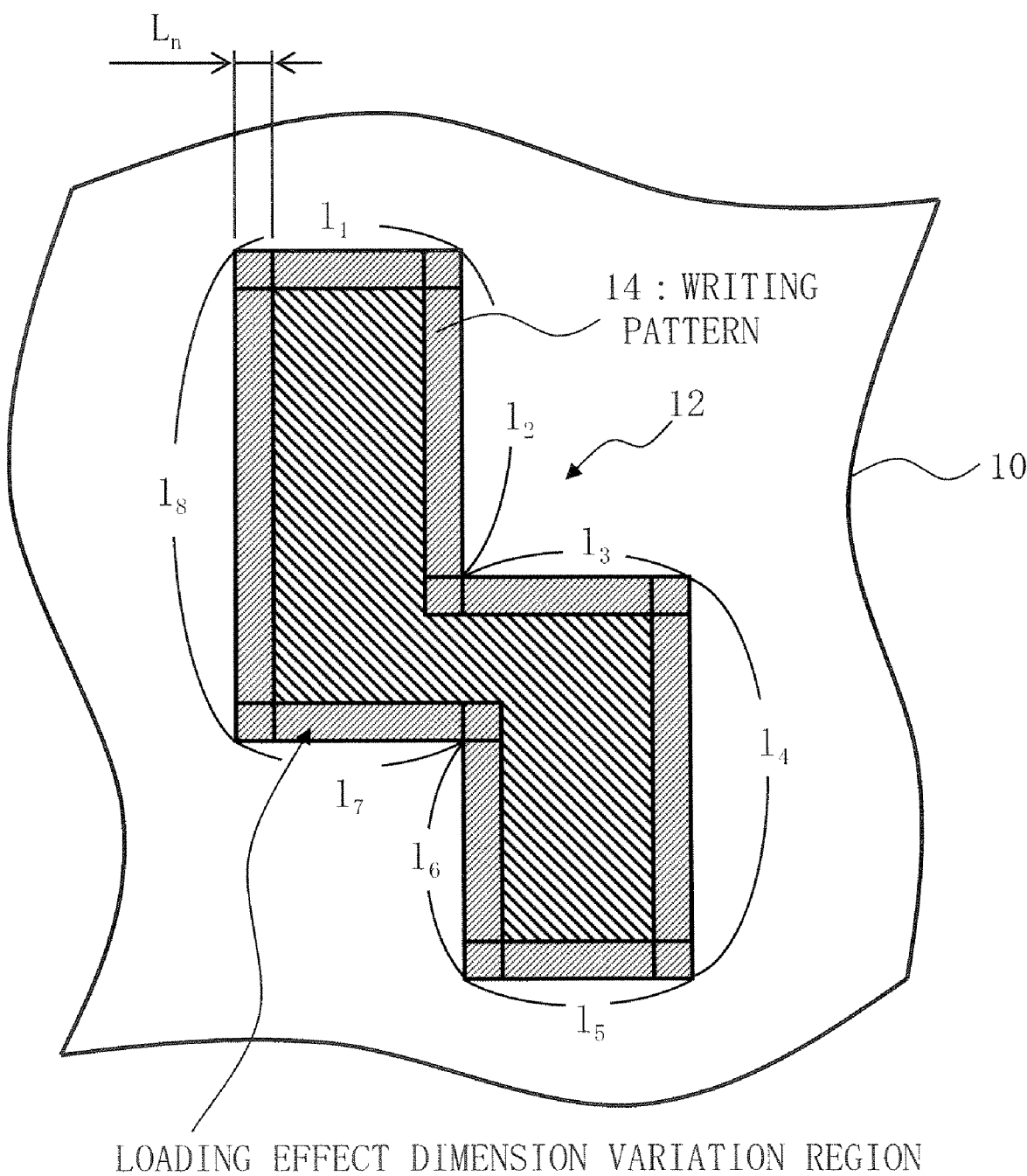
FIG. 2 is a diagram showing an example of a writing pattern obtained when the design pattern in FIG. 1 is written.

FIG. 2 is a diagram showing an example of a writing pattern obtained when the design pattern in FIG. 1 is written.

In the first embodiment, a method performed as follows when a design pattern 12 shown in FIG. 1 is formed on a target object 10 such as a mask will be described below. More specifically, a writing pattern 14 is written which is corrected from a pattern dimension, or "pattern size" (line width) of the design pattern 12 in advance by a region (hatched portion) of an amount of variation in dimension caused by loading effects as shown in FIG. 2 when a pattern is written. By using the writing pattern 14, a method of performing loading effect correction will be described below. In this embodiment, a case in which a pattern is formed on, for example, a mask as the target object 10 will be described. In this case, as a mask, a chromium (Cr) layer serving as a light-shielding film is formed on a glass substrate (quartz). A mask obtained by forming a resist film on the resultant structure is used as the mask. In this case, a case in which a variation in dimension caused by the loading effects is a positive variation will be described below.

In execution of loading effect correction, a CD error L(x, y) can be expressed by the following equation (1) in a conventional loading effect correction model. This CD error L(x, y) is an amount of variation in dimension caused by loading effects in an in-mask-plane.

$$L(x, y) = \gamma \Sigma \rho(x', y') \kappa(x-x', y-y') \Delta m + P(x, y) \quad (1)$$

In this case, a correction coefficient of loading effects is given by "γ". A pattern area density on design of one mesh region is given by "ρ(x, y)". A distribution function of the loading effects is given by "κ(x, y)". An area of one mesh region is given by "Δm". A CD error depending on an in-mask-plane position is given by "P(x, y)". In this case, symbol Σ means that a sum is calculated in each small region. For example, when an influence of loading effects extends for several mm to several cm, a dimension, or "size" of a mesh region for loading effect correction (to be described later) may be approximately 1-mm square. Reference symbols $x_i$ and $y_i$ denote a position of a typical point (for example, center) in an ith smallest mesh region. Reference symbol $\rho(x_i, y_i)$ indicates a pattern density in a certain mesh region having coordinates $(x_i, y_i)$. The above conditions are also satisfied in the following embodiments.

Figure 3:
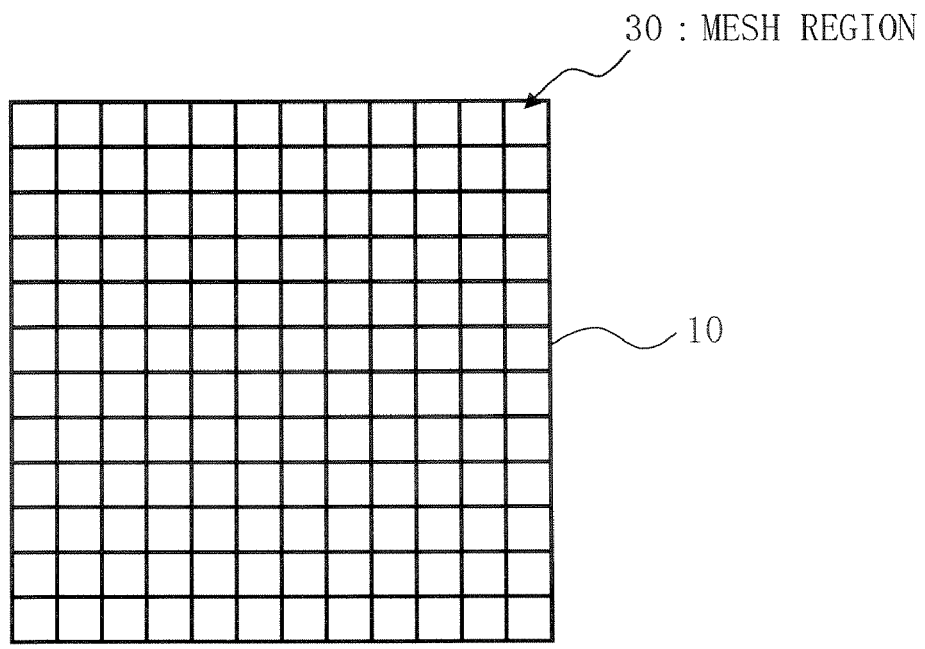
FIG. 3 is a conceptual diagram for explaining a mesh region in the first embodiment.

FIG. 3 is a conceptual diagram for explaining a mesh region in the first embodiment.

In the first embodiment, the target object 10 such as a mask as shown in FIG. 3 is virtually divided into a plurality of mesh regions 30 (square regions surrounded by grids) arranged like a mesh and each surrounded by grids defined at intervals of a predetermined dimension to try to calculate a model. An area of one mesh region 30 is defined as "Δm" in the above equation (1). Since a range of influence of the loading effects is generally in several-millimeter or several-centimeter order, the predetermined grid interval dimension (mesh size) m is preferably set at, for example, 1 mm.

Pattern resize writing is performed such that the CD error L(x, y) is subtracted from the pattern dimension of the design pattern 12, as described above, an exposed area of a chromium surface (or a resist surface) obtained after development changes. Assuming that a pattern area density ρ(x, y) becomes an actual pattern area density ρ'(x, y) after the writing, an actual CD error L'(x, y) can be expressed as described in the following equation (2). The actual CD error L'(x, y) is an amount of variation in dimension caused by actual loading effects.

$$L'(x, y) = \gamma \Sigma \rho'(x', y') \kappa(x-x', y-y') \Delta m + P(x, y) \quad (2)$$

Therefore, as a dimension error, a CD error corresponding to L(x, y)−L'(x, y) is generated. When a correction term of an area density is given by "C(x, y)", L(x, y) can be expressed as described in the following equation (3).

$$L(x, y) = \gamma \Sigma C(x', y') \rho(x', y') \kappa(x-x', y-y') \Delta m + P(x, y) \quad (3)$$

In this case, in order to eliminate the above-described correction residual in the loading effect correction, a condition given by L(x, y)−L'(x, y)=0 may be satisfied. Therefore, the condition can be expressed as described in the following equation (4).

$$\begin{aligned}L(x, y) - L'(s, y) &= \gamma \sum C(x', y) \rho(x', y') \kappa(x-x', y-y') \Delta m + P(x, y) - \\ &\quad \gamma \sum \rho'(x', y') \kappa(x-x', y-y') \Delta m + P(x, y) \\ &= \gamma \sum \left[ \frac{C(x', y') \rho(x', y') -}{\rho'(x', y')} \right] \kappa(x-x', y-y') \Delta m \\ &= 0 \end{aligned} \quad (4)$$

Therefore, in order to satisfy L(x, y)−L'(x, y)=0, the following equation (5) may be satisfied.

$$C(x, y) = \frac{\rho'(x, y)}{\rho(x, y)} \quad (5)$$

In this case, when a mesh region includes N graphics, the pattern area density ρ(x, y) can be expressed as described in the following equation (6) by using areas S of the respective graphics. However, for descriptive convenience in FIG. 1, one graphic is shown.

$$\rho(x, y) = \frac{\sum_{i=1}^{N} S_i}{\Delta m} \quad (6)$$

On the other hand, the actual pattern area density ρ'(x, y) can be expressed as described in the following equation (7) when the mesh region includes N graphics. In this case, a reduced area S' (area of the writing pattern 14) of each graphic by loading correction is used. In FIG. 1, however, one graphic is shown for descriptive convenience.

$$\rho'(x, y) = \frac{\sum_{i=1}^{N} S'_i}{\Delta m} \quad (7)$$

When an area error of each graphic caused by a correction residual is given by "ΔS", a condition given by S'=S−ΔS is satisfied. For this reason, the equation (5) can be expressed as described in the following equation (8).

$$\begin{aligned} C(x, y) &= \frac{\sum_{i=1}^{N} S'_i}{\sum_{i=1}^{N} S_i} \\ &= \frac{\sum_{i=1}^{N} (S_i - \Delta S_i)}{\sum_{i=1}^{N} S_i} \\ &= 1 - \frac{\sum_{i=1}^{N} (\Delta S_i)}{\sum_{i=1}^{N} S_i} \end{aligned} \quad (8)$$

The area error ΔS of the graphic is a value obtained by subtracting an area having overlapping apexes from a value obtained by multiplying a total sum $l_{sum}$ of lengths of the sides of the graphic by the CD error L(x, y) For example, in the example shown in FIG. 1, a total sum $l_{sum}$ of the lengths of the sides of the graphic=$l_1+l_2+l_3+l_4+l_5+l_6+l_7+l_8$.

In this case, a correction term C(x, y) of the area density is assigned to the CD error L(x, y). In this manner, the CD error L(x, y) serving as an amount of variation in dimension caused by loading effects can be expressed as described in the following recurring formula (9).

$$L_n(x,y) = \gamma \sum C_n(x',y')\rho(x',y')\kappa(x-x', y-y')\Delta m + P(x,y) \quad (9)$$

$$C_n(x,y) \begin{cases} 1.0 & (n=0) \\ 1 - \dfrac{\sum_{i=1}^{N} \Delta S_i}{\sum_{i=1}^{N} S_i} = 1 - \dfrac{l_{SUM} \cdot L_{n-1}(x,y)}{\sum_{i=1}^{N} S_i} + \dfrac{\text{(the number of apexes)} \cdot L_{n-1}(x,y)^2}{\sum_{i=1}^{N} S_i} & (n>0) \end{cases}$$

In this case, the number of times of iterative calculation is defined as "n". By using the CD error $L_n(x, y)$, iterative calculation of the following equation (10) will be performed.

$$L_n(x,y) - L_{n-1}(x,y) < \Delta \quad (10)$$

The calculation is performed until a value of $L_n(x, y)-L_{n-1}(x, y)$ in the equation (10) is smaller than a desired dimension error Δ. In this manner, the correction residual can be made small (reduced).

Figure 4:
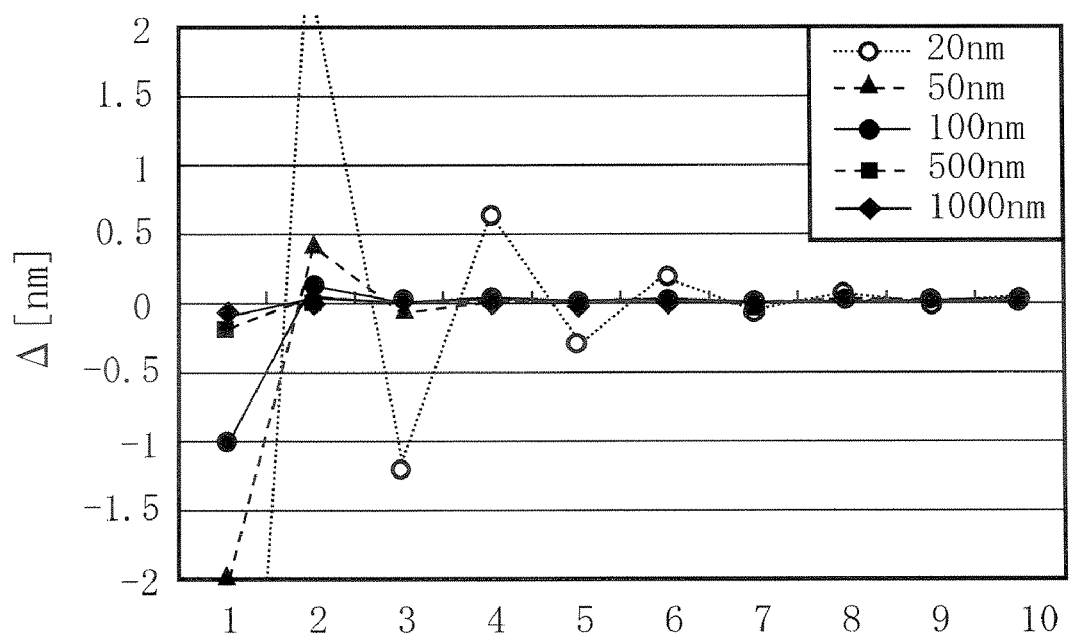
FIG. 4 is a graph showing an example of an iterative calculation result in the first embodiment.

FIG. 4 is a graph showing an example of an iterative calculation result in the first embodiment.

In FIG. 4, an example calculated by a 1:1L/S (1:1 line and space) pattern is shown. In addition, a correction coefficient of the loading effects is given by γ=20 nm, and a mesh size is given by m=about 0.5 mm. The calculation is performed at a plurality of pattern dimensions (line widths). As is apparent from FIG. 4, when the iterative calculation is performed, the value of $L_n(x, y)-L_{n-1}(x, y)$ is small and converged.

Therefore, the writing is performed such that the CD error $L_n(x, y)$ not larger than the desired value Δ changes into the dimension $CD_d(=CD_0-L_n(x, y))$ corrected from the pattern dimension $CD_0$ of the design pattern 12 as the amount of pattern dimension correction. In this manner, the line width $CD_f$ of the actual pattern completed through the loading effects such as the etching step is also given by $CD_f \approx CD_d = CD_0 - L_n(x, y)$. In this manner, a correction residual of the loading effect correction can be reduced or eliminated.

In this case, the number of times of iterative calculation n may be appropriately set depending on required accuracy or required calculation time. The term $L_{n-1}(x, y)^2$ in the equation (9) may be ignored as necessary. In practice, correction can be performed at high accuracy when n=1. A total sum of lengths of sides of each graphic in each mesh region, a total sum of areas of the graphics, and the like may be left as mesh information together with the number of patterns N.

As described above, a correction term C(x, y) of an area density is defined by using an area S of patterns included in each mesh region as expressed by the equation (9) and a total sum $l_{sum}$ of lengths of circumferential sides of the patterns. The area S of the patterns mentioned here includes a case in which an area S of patterns of the correction term C(x, y) of the area density and an area error ΔS of the graphics are defined as pattern densities. The correction term C(x, y) of the area density is used to correct an amount of dimension correction for loading effect correction expressed by the original equation (1) defined by a pattern area density ρ(x, y) or the like. By the correction, the dimension $CD_0$ of the design pattern 12 is changed like the dimension $CD_d$ of the writing pattern 14.

In this manner, a pattern dimension is changed by using the area of the patterns included in each square region (mesh region) (including a case in which the area is defined by a pattern density) and a total sum of lengths of the circumferential sides of the patterns. For this reason, when the dimension of a pattern to be written is corrected in advance from a design line width by a variation in dimension caused by loading effects, the correction can be performed by an amount of pattern dimension correction obtained in consideration of a change in pattern density. By this method, it is possible to correct a dimension error Δ which is generated by loading effects and which is a correction residual of a pattern formed on the target object 10. The dimension error Δ of the pattern can be further reduced by performing iterative calculation according to the equation (10) until the error falls within a desired range.

By using an existing writing apparatus, a pattern is written to obtain the dimension $CD_d$ of the writing pattern 14 the dimension of which is changed previously. Consequently, the dimension $CD_f$ of the pattern completed through the loading effects is made a value the dimension error of which is reduced or eliminated. Therefore, the dimension $CD_f$ can be formed according to a design.

Second Embodiment

In the first embodiment, iterative calculation is performed by using the correction term C(x, y) of the area density to calculate the CD error $L_n(x, y)$ which is smaller than the desired value Δ. The CD error $L_n(x, y)$ serves as an amount of dimension correction to change the dimension $CD_0$ of the design pattern 12 like the dimension $CD_d$ of the writing pattern 14. However, a method of calculating an amount of dimension calculation is not limited to the method described above. In the second embodiment, another method of calculating an amount of dimension correction will be described below. Unless otherwise noted, reference symbols or reference numerals are the same as those in the first embodiment. Also in the second embodiment, as shown in FIG. 3, the second embodiment is the same as the first embodiment in that a target object is virtually divided into mesh regions as shown in FIG. 3 to obtain a model.

A variation in dimension L(x, y) caused by loading effects or the like or a process or the like can be expressed by the following equation (11).

$$L(x,y) = \gamma \int \kappa(x-x', y-y')dx'dy' + P(x,y) \quad (11)$$

In this case, a distribution function κ(x, y) of loading effects can be expressed by, for example, the following equation (12-1) or equation (12-2). Depending on an apparatus for use in etching or the like, another appropriate function may be used.

$$\kappa(x, y) = \frac{1}{\pi\sigma_L^2} e^{-\frac{x^2+y^2}{\sigma_L^2}} \quad (12\text{-}1)$$

$$\kappa(x, y) = \frac{1}{\pi\sigma_{L_1}^2} e^{-\frac{x^2+y^2}{\sigma_{L_1}^2}} + \gamma_2 \frac{1}{\pi\sigma_{L_2}^2} e^{-\frac{x^2+y^2}{\sigma_{L_2}^2}} \quad (12\text{-}2)$$

As a distribution function κ(x, y) of loading effects, an optimum distribution function may be appropriately used depending to a process or the like to be used. Integration in the equation (11) is executed only for a pattern to be written. In this case, reference symbols $\sigma_L$ $\sigma_{L1}$, and $\sigma_{L2}$ denote distances to which the loading effects influence, for example, the distances are about several mm to several cm. In actual calculation, integration may be calculated by a sum as described in the equation (1). For example, when $\sigma_L$ is 1 cm, a mesh size may be set at 1-mm square.

In order to correct a pattern at a certain place (x, y), it is assumed that the dimension of the pattern is reduced from the dimension $CD_0$ of the design pattern 12 by an amount of dimension correction Δl(x, y). In this case, a difference Δ(x, y) between the design value (dimension $CD_0$) and the dimension $CD_f$ of the completed pattern after the etching step or the like can be expressed by the following equation (13).

$$\Delta(x, y) = -\Delta l(x, y) + \gamma\int\kappa(x-x', y-y')dx'dy' + P(x, y) \quad (13)$$

When the equation (13) is to be expressed by a mesh, integration is a sum, and the following equation (14) can be given.

$$\Delta(x_i, y_i) = \quad (14)$$
$$-\Delta l(x_i, y_i) + \gamma\sum_j \kappa(x_i - x'_j, y_i - y'_j)\rho(x'_j, y'_j)\Delta m + P(x_i, y_i)$$

In this case, reference symbol i is a serial number allocated to the mesh, reference symbol $(x_i, y_i)$ denotes coordinates of a typical point (for example, a center) of an "i"th mesh, and a sum is calculated with respect to a mesh which influences the ith mesh.

The first terms of the right-hand sides of the equation (13) and equation (14) mean that patterns are reduced by Δl(x, y). The second term is a term which expresses a variation in dimension depending on a density generated by a pattern reduced by Δl(x, y). Reference symbol $\rho(x_j, y_j)$ denotes a density of a reduced pattern in a jth mesh. The third terms of the right-hand sides of the equation (13) and equation (14) denote variations in dimension generated depending on positions.

Figure 5:
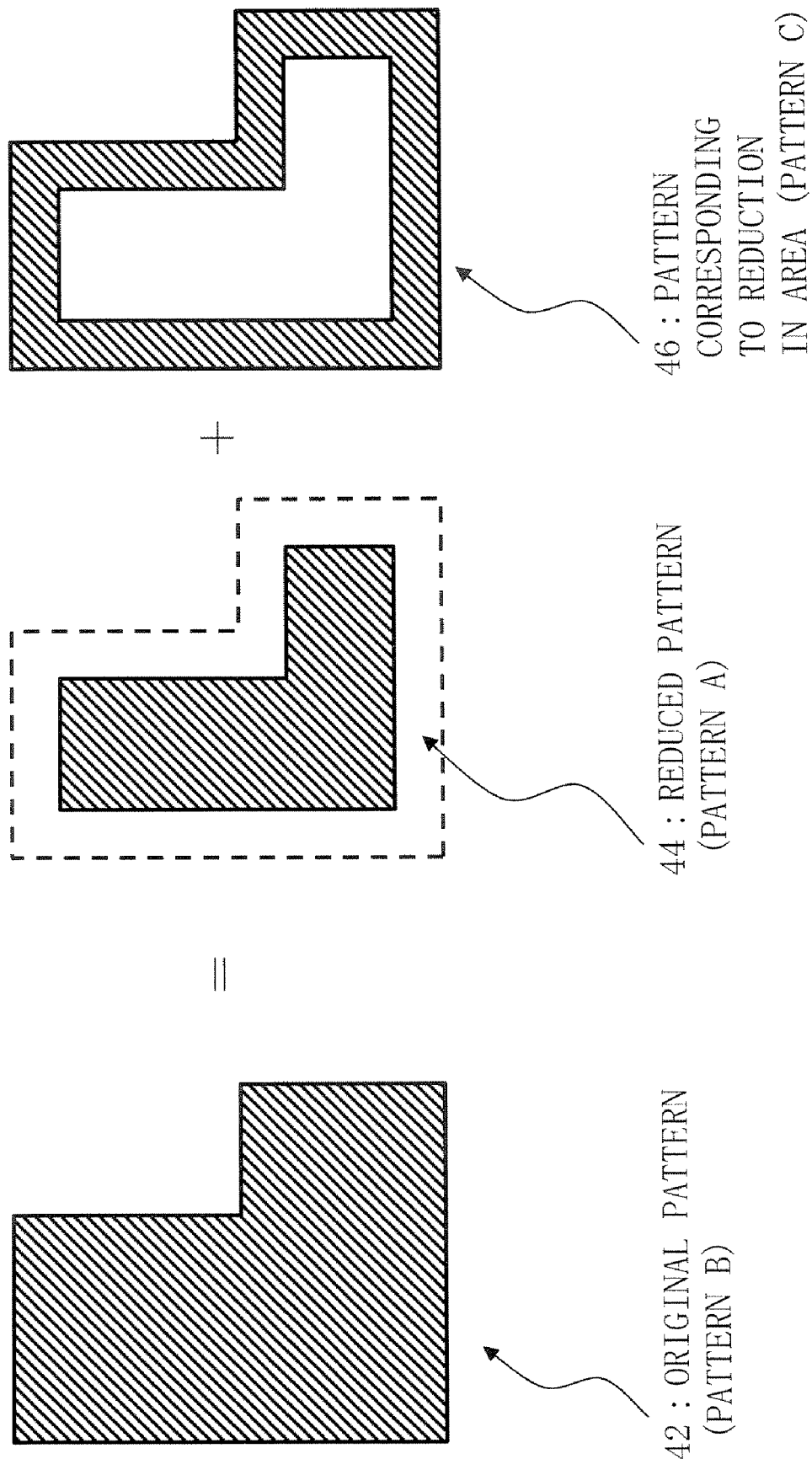
FIG. 5 is a diagram showing an example of a pattern formed in a second embodiment.

FIG. 5 is a diagram showing an example of a pattern formed in the second embodiment.

In FIG. 5, an original pattern 42 (pattern B) serving as a design pattern, a pattern 44 (pattern A) reduced for loading correction, and a reduced pattern 46 (pattern C) corresponding to the reduction of the pattern 44. In the pattern configuration, the second term of the right-hand side of the equation (14) can be changed as described in the following equation (15).

$$\gamma\sum_{j:\text{pattern } A} \kappa(x_i - x_j, y_i - y_j)\rho(x_j, y_j)\Delta m = \quad (15)$$
$$\gamma\sum_{j:\text{pattern } B} \kappa(x_i - x_j, y_i - y_j)\rho_B(x_j, y_j)\Delta m -$$
$$\gamma\sum_{j:\text{pattern } C} \kappa(x_i - x_j, y_i - y_j)\rho_C(x_j, y_j)\Delta m$$

In this case, reference symbol $\rho_B$ denotes a pattern density in each region of a pattern B. Reference symbol $\rho_C$ denotes a pattern density in each region of a pattern C. When a term to be integrated by the pattern C is expressed by a sum, the following equation (16) can be obtained.

$$\gamma\sum_{j:\text{pattern } C} \kappa(x_i - x_j, y_i - y_j)\rho_C(x_j, y_j)\Delta m = \quad (16)$$
$$\gamma\left\{\sum_{j:\text{pattern } B}\left[l_{SUM}(x_j, y_j) \cdot \frac{\Delta l(x'_j, y'_j)}{2} - \right.\right.$$
$$\left.\left.(\text{constant of apex}) \cdot \Delta l(x'_j, y'_j)^2\right] \times \kappa(x_i - x'_j, y_i - y'_j)\right\}$$

In this case, reference symbol $l_{SUM}(x_j, y_j)$ denotes a total sum of sides (not total sum of area) of the original pattern (pattern B) in the jth mesh.

Figure 6:
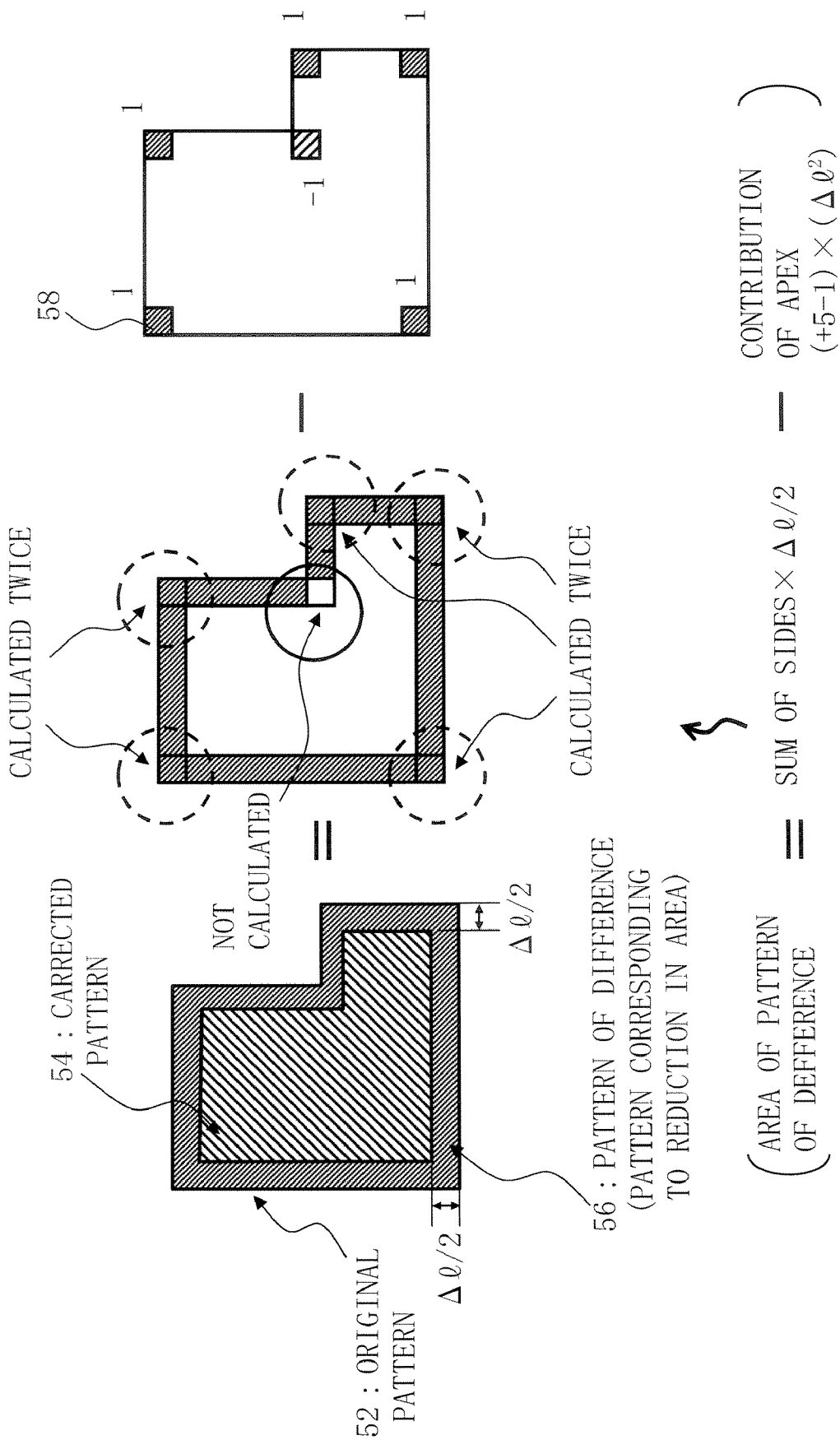
FIG. 6 is a diagram for explaining an area of a pattern reduced in the second embodiment.

FIG. 6 is a diagram for explaining an area of the reduction of the pattern in the second embodiment. FIG. 6 shows a case in which one graphic is used. This shows a case in which an original pattern 52 is reduced like a corrected pattern 54. Here, when the area of a pattern 56 corresponding to the reduction of the original pattern 52 is estimated by a total sum of sides, a term using $l_{SUM}(x_j, y_j)$ of the right-hand side of the equation (16) is obtained. However, as shown in FIG. 6, when a length of sides of the original pattern 52 is used, an area may be counted twice at a certain apex 58, and an area may not be counted at another apex 58. Therefore, the double counting or lack of calculation must be adjusted. This adjustment is performed by a term using a "constant of apex" of the right-hand side of the equation (16). For example, in the case in FIG. 6, as contribution of this term at all apexes, an area of a difference pattern is a value obtained by subtracting a value obtained by multiplying a difference between the number of apexes at which double counting is performed and the number of apexes at which counting is not performed by a square of Δl from [(total sum of sides)×Δl/2].

Figure 7:
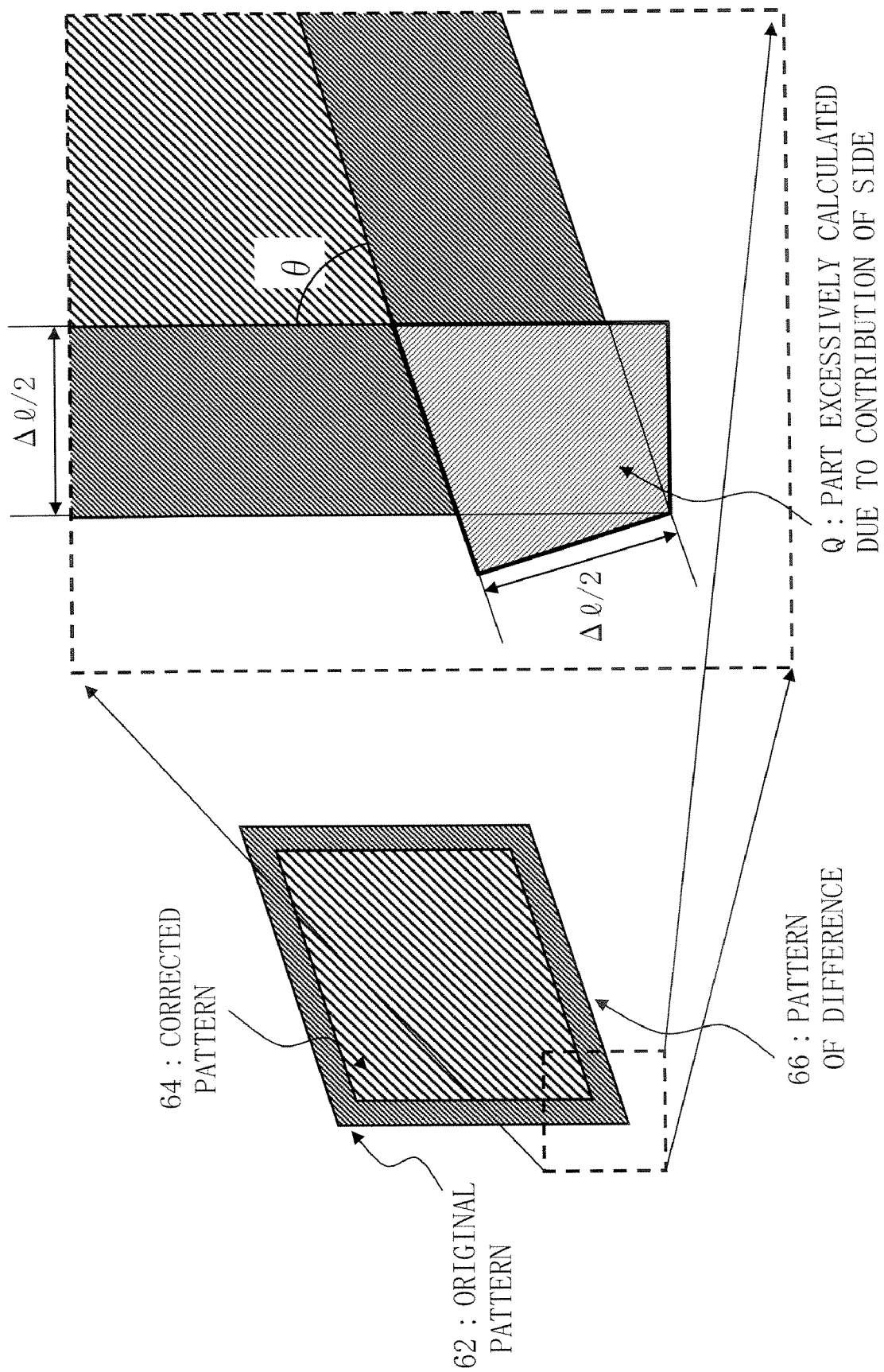
FIG. 7 is a diagram for explaining an area error generated at an apex of the pattern according to the second embodiment.

FIG. 7 is a diagram for explaining an area error generated at an apex of a pattern in the second embodiment. For example, a pattern 66 corresponding a reduction in area of an original pattern 62 reduced like a corrected pattern 64 is supposed. An error of the areas generated at apexes each having an angle θ is a region Q. Therefore, an area of the region Q at each apex at which double counting is performed is calculated, and correction may be performed for the area of the region Q. The area of the region Q is given by the "constant of apex"×Δl(x, y)² described above. It is understood that the "constant of apex" at the angle of θ is expressed by the following equation (17) by calculating the area of the region Q.

$$\frac{1}{4} \cdot \frac{\cos\frac{\theta}{2}}{\sin\frac{\theta}{2}} \quad (17)$$

When there are a plurality of apexes, a total sum of values each obtained by multiplying each "constant of apex" by the square of Δl. Therefore, the equation (16) can be expressed by the following equation (18).

$$\gamma \sum_{j:pattern\ C} \kappa(x_i - x_j, y_i - y_j)\rho_C(x_j, y_j)\Delta m = \quad (18)$$

$$\gamma \left\{ \sum_{j:pattern\ B} \left[ l_{SUM}(x_j, y_j) \cdot \frac{\Delta l(x'_j, y'_j)}{2} - \sum_{apex\ i} \left[ \frac{1}{4} \cdot \frac{\cos\left(\frac{\theta_i}{2}\right)}{\sin\left(\frac{\theta_i}{2}\right)} \right] \cdot \Delta l(x'_j, y'_j)^2 \right] \times \kappa(x_i - x'_j, y_i - y'_j) \right\}$$

Solutions used thereafter will be explained in cases 1 to 3. A solution in case 1 will be described first.

Case 1

In case 1, a solution is executed such that Δl(x, y)² in the equation (16) is ignored as a secondary small term. In this manner, when Δl(x, y)² is ignored, the equation (16) can be approximated by the following equation (19).

$$\gamma \sum_{j:pattern\ C} \kappa(x_i - x_j, y_i - y_j)\rho_C(x_j, y_j)\Delta m \approx \quad (19)$$

$$\left\{ \sum_{j:pattern\ B} \gamma \cdot l_{SUM} \cdot \frac{\Delta l(x'_i, y'_i)}{2} \cdot \kappa(x_i - x'_i, y_i - y'_i) \right\}$$

Furthermore, it is assumed that a variation of an amount of dimension correction Δl(x$_i$', y$_i$') is small, and the variation is taken no account of the sum to give Δl(x$_i$, y$_i$). In this case, the equation (19) can be approximated by the following equation (2).

$$\gamma \sum_{j:pattern\ C} \kappa(x_i - x_j, y_i - y_j)\rho(x_j, y_j)\Delta m \approx \quad (20)$$

$$\gamma \left\{ \frac{\Delta l(x_i, y_i)}{2} \sum_{j:pattern\ B} [l_{SUM}(x'_j, y'_j)] \times \kappa(x_i - x'_j, y_i - y'_j) \right\}$$

Therefore, the equation (15) can be expressed by the following equation (21).

$$\gamma \sum_{j:pattern\ A} \kappa(x_i - x_j, y_i - y_j)\rho(x_j, y_j)\Delta m = \quad (21)$$

$$\gamma \sum_{j:pattern\ B} \kappa(x_i - x_j, y_i - y_j)\rho(x_j, y_j)\Delta m -$$

-continued $$\gamma \left\{ \frac{\Delta l(x_i, y_i)}{2} \sum_{j:pattern\ B} [l_{SUM}(x'_j, y'_j)] \times \kappa(x_i - x'_j, y_i - y'_j) \right\}$$

When the equation (21) is assigned to the equation (14), the equation (21) can be expressed by the following equation (22).

$$\Delta(x_i, y_i) = -\Delta l(x_i, y_i) + \gamma \sum_{j:pattern\ B} \kappa(x_i - x_j, y_i - y_j)\rho(x_j, y_j)\Delta m - \quad (22)$$

$$\gamma \frac{\Delta l(x_i, y_i)}{2} \sum_{j:pattern\ B} [l_{SUM}(x'_j, y'_j) \times \kappa(x_i - x'_j, y_i - y'_j)] + P(x_i, y_i)$$

In this case, in order to obtain the dimension CD$_f$ of the pattern completed through the loading effects as designed, Δ(x, y)=0 may be satisfied. Therefore, in the equation (22), an amount of dimension correction Δl(x, y) is calculated such that Δ(x, y)=0 is satisfied, the following equation (23) is obtained.

$$\Delta l(x_i, y_i) = \frac{\gamma \sum_{j:pattern\ B} \kappa(x_i - x_j, y_i - y_j)\rho(x_j, y_j)\Delta m + P(x_i, y_i)}{1 + \frac{\gamma}{2} \sum_{j:pattern\ B} [l_{SUM}(x'_j, y'_j) \times \kappa(x_i - x'_j, y_i - y'_j)]} \quad (23)$$

When the equation (23) is expressed by continuous coordinates and integration, the following equation (24) is obtained.

$$\Delta l(x_i, y_i) = \frac{\gamma \int_{pattern\ B} \kappa(x - x', y - y')dx'dy' + P(x, y)}{1 + \frac{\gamma}{2} \sum_{j:pattern\ B} [l_{SUM}(x'_j, y'_j) \cdot \kappa(x_i - x'_j, y_i - y'_j)]} \quad (24)$$

The numerators of the equation (23) and equation (24) correspond to amounts of dimension correction of patterns performed by conventional loading effect correction. More specifically, the amount of correction is a conventional amount of correction calculated by using only a pattern area density ρ(x, y) while ignoring an influence of a reduction of a pattern. In this method, the amount of correction is modulated by a "term including a total sum of sides of each mesh" expressed as the numerator to obtain a form from which a correction residue is removed. The modification makes it possible to obtain an amount of pattern dimension correction Δl(x, y) the correction residual of which is reduced or eliminated The dimension CD$_0$ of the design pattern is changed into the corrected dimension CD$_d$ in advance by the amount of pattern dimension correction Δl(x, y).

By using an existing writing apparatus, a pattern is written to obtain the dimension CD$_d$ of the writing pattern 14 the dimension of which is changed previously. In this manner, the dimension CD$_f$ of the pattern completed through the loading effects can be made a value the dimension error of which is reduced or eliminated. Therefore, a pattern having the dimension CD$_f$ can be formed as designed.

In this case, in the equation (19), Δl(x, y)² in the equation (16) is ignored as a secondary small term, and the variation of Δl(x, y) is taken no account of integration to found a solution.

However, the invention is not limited to the solution. Other examples will be explained in cases 2 and 3.

Case 2

In this case, with respect to a graphic in a region having coordinates $(x_j, y_j)$ as a center, $SumE(x_i, y_i)=$(sum of lengths of sides)/2 is defined. In addition, $ContP(x_i, y_i)=\Sigma\{\cos(\theta_i/2)/[4\sin(\theta_i/2]\}$ is defined. Reference symbol $\Delta_L \times \Delta_L$ denotes a mesh dimension. In this case, the equation (19) can be expressed by the following equation (25).

$$\gamma \sum_{j:pattern\ C} \kappa(x_i - x_j, y_i - y_j) \rho_C(x_j, x_j) \Delta m = \qquad (25)$$
$$\gamma \sum_{i,j} \{SumE(x'_i, y'_i)/\Delta_L^2\} \cdot \Delta l(x'_i, y'_i) \cdot \kappa(x_i - x'_i, y_i - y'_i) \cdot \Delta_L^2 -$$
$$\gamma \sum_{i,j} \{ContP(x'_i, y'_i)/\Delta_L^2\} \cdot \Delta l(x'_i, y'_i)^2 \cdot \kappa(x_i - x'_i, y_i - y'_i) \cdot \Delta_L^2$$

According to the equation (25), equation (15) and equation (14), the equation (22) can be expressed by the following equation (26).

$$\Delta(x_i, y_i) = \qquad (26)$$
$$-\Delta l(x_i, y_i) + \gamma \sum_{patternB:j} \{l_{sum}(x'_j, y'_j)\kappa(x_i - x'_j, y_i - y'_j)\} + P(x_i, y_i) -$$
$$\gamma \sum_{i,j} \{SumE(x'_i, y'_i)/\Delta_L^2\} \cdot \Delta l(x'_i, y'_i) \cdot \kappa(x_i - x'_i, y_i - y'_i) \cdot \Delta_L^2 +$$
$$\gamma \sum_{i,j} \{ContP(x'_i, y'_i)/\Delta_L^2\} \cdot \Delta l(x'_i, y'_i)^2 \cdot \kappa(x_i - x'_i, y_i - y'_i) \cdot \Delta_L^2$$

In order to make a correction error zero, $\Delta(x, y)=0$ is satisfied. The following equation (27) is given as follows.

$$\Delta l(x_i, y_i) = \gamma \sum_{patternB:j} \{l_{sum}(x'_j, y'_j)\kappa(x_i - x'_j, y_i - y'_j)\} + P(x_i, y_i) - \qquad (27)$$
$$\gamma \sum_{i,j} \{SumE(x'_i, y'_i)/\Delta_L^2\} \cdot \Delta l(x'_i, y'_i) \cdot \kappa(x_i - x'_i, y_i - y'_i) \cdot \Delta_L^2 +$$
$$\gamma \sum_{i,j} \{ContP(x'_i, y'_i)/\Delta_L^2\} \cdot \Delta l(x'_i, y'_i)^2 \cdot \kappa(x_i - x'_i, y_i - y'_i) \cdot \Delta_L^2$$

An amount of dimension correction $\Delta l(x, y)$ is calculated as follows. The function $\Delta l(x, y)$ can be defined as expressed in the following equation (28).

$$\Delta l(x, y) = \lim_{n \to \infty} l_n(x, y) \qquad (28)$$
$$l_n(x, y) = l_{n-1}(x, y) + d_n(x, y)$$

In case 2, it is assumed that an influence of apexes can be ignored while considering contribution of sides, and a solution is found. At this time, $l_1(x, y)$ can be expressed by the following equation (29).

$$l_1(x, y) = \left\{ \gamma \int_A \kappa(x - x', y - y') \cdot \rho(x'_{k,l}, y'_{k,l}) dx' dy' + P(x_i, y_i) \right\} / \qquad (29)$$

-continued
$$\left[ 1 + \gamma \int_A \{SumE(x', y')/\Delta_L^2\} \cdot \kappa(x - x', y - y') dx' dy' \right]$$

In this equation and the following equations, a sum of i and j is expressed as integration on the assumption that $\Delta_L$ is sufficiently small. It is assumed that the integration is performed to all the regions and is represented by A. Reference symbol $d_n(x, y)$ can be expressed by the following equation (30).

$$d_n(x, y) = \qquad (30)$$
$$-\varepsilon_n \bigg/ \left[ 1 + \gamma \int_A \{SumE(x', y')/\Delta_L^2\} \cdot \kappa(x - x', y - y') dx' dy' \right]$$

In this case, $\epsilon_n(x, y)$ is given by the following equation (31).

$$\varepsilon_n(x, y) = l_{n-1}(x, y) + \qquad (31)$$
$$\gamma \int_A \{SumE(x', y')/\Delta_L^2\} \cdot l_{n-1}(x', y') \cdot \kappa(x - x', y - y') dx' dy' -$$
$$\gamma \int_A \kappa(x - x', y - y') \cdot \rho(x'_{k,l}, y'_{k,l}) dx' dy' - P(x_i, y_i)$$

As described above, the amount of dimension correction $\Delta l(x, y)$ is gradually converged. As a result, a highly accurate value can be derived. Furthermore, in order to increase accuracy, the following case 3 is preferably used.

Case 3

In case 3, a solution is found in consideration of contribution of sides and apexes. A solution in the form of the equation (28) is given. First, a function $a_1(x, y)$ is defined as expressed by the following equation (32).

$$a_1(x, y) = -\gamma \int_A \{ContP(x', y')/\Delta_L^2\} \cdot \kappa(x - x', y - y') dx' dy' \qquad (32)$$

A function $b_1(x, y)$ is defined as expressed by the following equation (33).

$$b_1(x, y) = \left\{ 1 + \gamma \int_A \{SumE(x', y')/\Delta_L^2\} \cdot \kappa(x - x', y - y') dx' dy' \right\} \qquad (33)$$

A function $c_1(x, y)$ is defined as expressed by the following equation (34).

$$c_1(x, y) = -\gamma \int_A \kappa(x - x', y - y') \cdot \rho(x'_{k,l}, y'_{k,l}) dx' dy' + P(x_i, y_i) \qquad (34)$$

A function $a_n(x, y)$ is defined as expressed by the following expression (35).

$$a_n(x, y) = -\gamma \int_A \{ContP(x', y')/\Delta_L^2\} \cdot \kappa(x - x', y - y') dx' dy' \qquad (35)$$

A function $b_n(x, y)$ is defined as expressed by the following expression (36).

$$b_n(x, y) = 1 + \gamma \int_A \{SumE(x', y')/\Delta_L^2\} \cdot \kappa(x-x', y-y')dx'dy' - \gamma \int_A \{ContP(x', y')/\Delta_L^2\} \cdot 2l_{n-1}(x', y') \cdot \kappa(x-x', y-y')dx'dy' \quad (36)$$

A function $c_n(x, y)$ is defined as expressed by the following expression (37).

$$c_n(x, y) = l_{n-1}(x, y) + \gamma \int_A \{SumE(x', y')/\Delta_L^2\} \cdot l_{n-1}(x', y') \cdot \kappa(x-x', y-y')dx'dy' - \gamma \int_A \{ContP(x', y')/\Delta_L^2\} \cdot l_{n-1}(x', y')^2 \cdot \kappa(x-x', y-y')dx'dy' - \gamma \int_A \kappa(x-x', y-y') \cdot \rho(x'_{k,l}, y'_{k,l})dxdy - P(x_i, y_i) \quad (37)$$

When the respective defined functions are used, $l_1(x, y)$ can be expressed as follows. When $a_1(x, y) \cdot b_1(x, y) \geqq 0$, $l_1(x, y)$ can be expressed by the following equation (38).

$$l_1(x, y) = \{-b_1(x, y) + \sqrt{b_1(x,y)^2 - 4a_1(x,y) \cdot c_1(x,y)}\}/2a_1(x, y) \quad (38)$$

Alternatively, when $a_1(x, y) \cdot b_1(x, y) < 0$, $l_1(x, y)$ can be expressed by the following equation (39).

$$l_1(x, y) = \{-b_1(x, y) - \sqrt{b_1(x,y)^2 - 4a_1(x,y) \cdot c_1(x,y)}\}/2a_1(x, y) \quad (39)$$

Alternatively, when $a_1(x, y) = 0$, $l_1(x, y)$ can be expressed by the following equation (40).

$$l_1(x, y) = -c_1(x, y)/b_1(x, y) \quad (40)$$

When $a_1(x, y) \cdot b_1(x, y) > 0$, $d_n(x, y)$ can be expressed by the following equation (41).

$$d_n(x, y) = \{-b_n(x, y) + \sqrt{b_n(x,y)^2 - 4a_n(x,y) \cdot c_n(x,y)}\}/2a_n(x, y) \quad (41)$$

Alternatively, when $a_1(x, y) \cdot b_1(x, y) < 0$, $d_n(x, y)$ can be expressed by the following equation (42).

$$d_n(x, y) = \{-b_n(x, y) - \sqrt{b_n(x,y)^2 - 4a_n(x,y) \cdot c_n(x,y)}\}/2a_n(x, y) \quad (42)$$

Alternatively, when $a_1(x, y) = 0$, $d_n(x, y)$ can be expressed by the following equation (43).

$$l_n(x, y) = -c_n(x, y)/b_n(x, y) \quad (43)$$

When a length of a minimum side of a pattern is represented by $L_{min}$, dimensions of $a_1(x, y)$ and $a_n(x, y)$ described above are approximately equal to a dimension expressed by the following equation (44).

$$a_1(x, y), a_n(x, y) \approx \gamma/L_{min}^2 \quad (44)$$

Sizes of $b_1(x, y)$ and $b_n(x, y)$ are approximately equal to a dimension expressed by the following equation (45).

$$b_1(x, y), b_n(x, y) \approx 1 + \gamma/L_{min} \quad (45)$$

Sizes of $c_1(x, y)$ and $c_n(x, y)$ are approximately equal to a dimension expressed by the following equation (46).

$$c_1(x, y), c_n(x, y) \approx \gamma + \{\text{max-value of } P(x_i, y_i)\} \quad (46)$$

In this case, when $\gamma/L_{min}$ is defined as $\xi$, the dimensions of $b_1(x, y)$ and $b_n(x, y)$ can be expressed by the following equation (47).

$$b_1(x, y), b_n(x, y) \approx 1 + \zeta \quad (47)$$

In this case, when it is assumed that $L_{min}$ is sufficiently smaller than $\gamma$ (assumption 1), $\xi$ is a small amount. Therefore, $b_1(x, y)$ and $b_n(x, y)$ do not become zero. Terms in square roots included in the equation (38), equation (39), equation (41) and equation (42) can be expressed by the following equation (48).

$$b_1(x, y)^2 - 4a_1(x, y) \cdot c_1(x, y) \approx b_n(x, y)^2 - 4a_n(x, y) \cdot c_n(x, y) \approx 1 - 4\zeta^2 \quad (48)$$

Since the value $\xi$ is a small amount, the equation (48) do not have a negative value. Therefore, under the above assumption 1, the terms in the square roots do not have negative values. Accordingly, solutions of the equation (38), equation (39), equation (41), and equation (42) do not become imaginary roots. Calculation need not be performed an infinite number of times. The number of times of calculation may be determined depending on necessary accuracy. For example, the calculation may be ended until $l_1(x, y)$ is obtained, or the calculation may be performed until $l_3(x, y)$ is obtained. When the number of times of calculation is increased, the accuracy of the amount of dimension correction $\Delta l(x, y)$ can be improved. A correction residual will be evaluated as follows.

Figure 8:
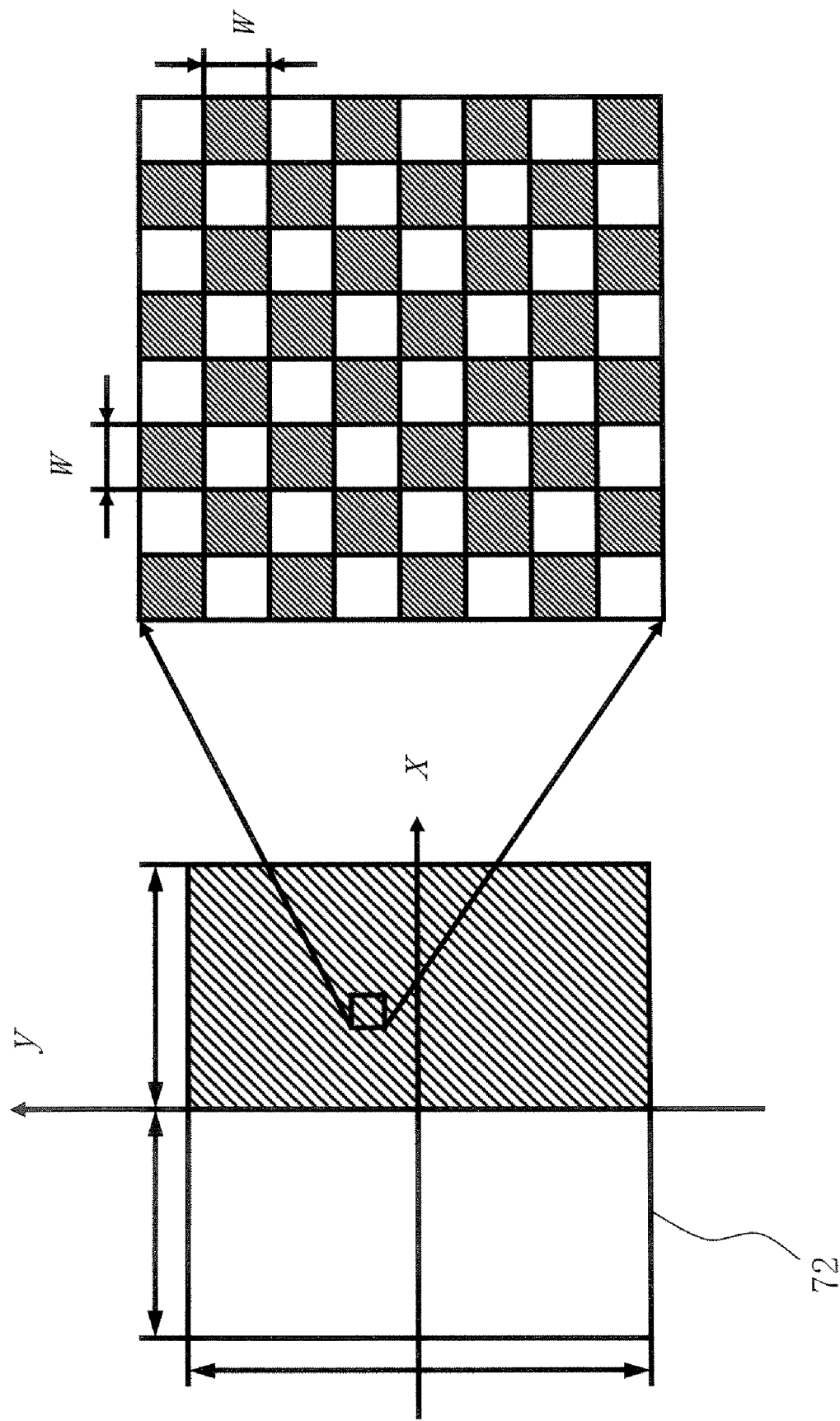
FIG. 8 is a diagram showing an example of a pattern for measuring a correction error in the second embodiment.

FIG. 8 is a diagram showing an example of a pattern for measuring a correction error in the second embodiment.

A checker board pattern (chest board pattern) is formed on a right half of a writing region 72 serving as a two-dimensional plane. Each square dimension is defined as w×w. In this case, a pattern density $\rho(x, y)$ can be expressed by the following equation (49).

$$\rho(x, y) = \frac{1}{2}(x, y \geqq 0)$$

$$0(x, y < 0) \quad (49)$$

A function $SumE(x, y)$ can be expressed by the following equation (50).

$$SumE(x, y) = 1/w \ (x, y \geqq 0)$$

$$0(x, y < 0) \quad (50)$$

A function $ContP(x, y)$ can be expressed by the following equation (51).

$$ContP(x, y) = 2/w^2 \ (x, y \geqq 0)$$

$$0(x, y < 0) \quad (51)$$

In the above explanation, when one graphic is formed across a plurality of small regions, contributions of sides and apexes included in each region may be added to the corresponding small region. However, when the dimension of a graphic is sufficiently smaller than a dimension of $\Delta_L$ of the region, all contributions of the graphic may be added to one region.

Figure 9:
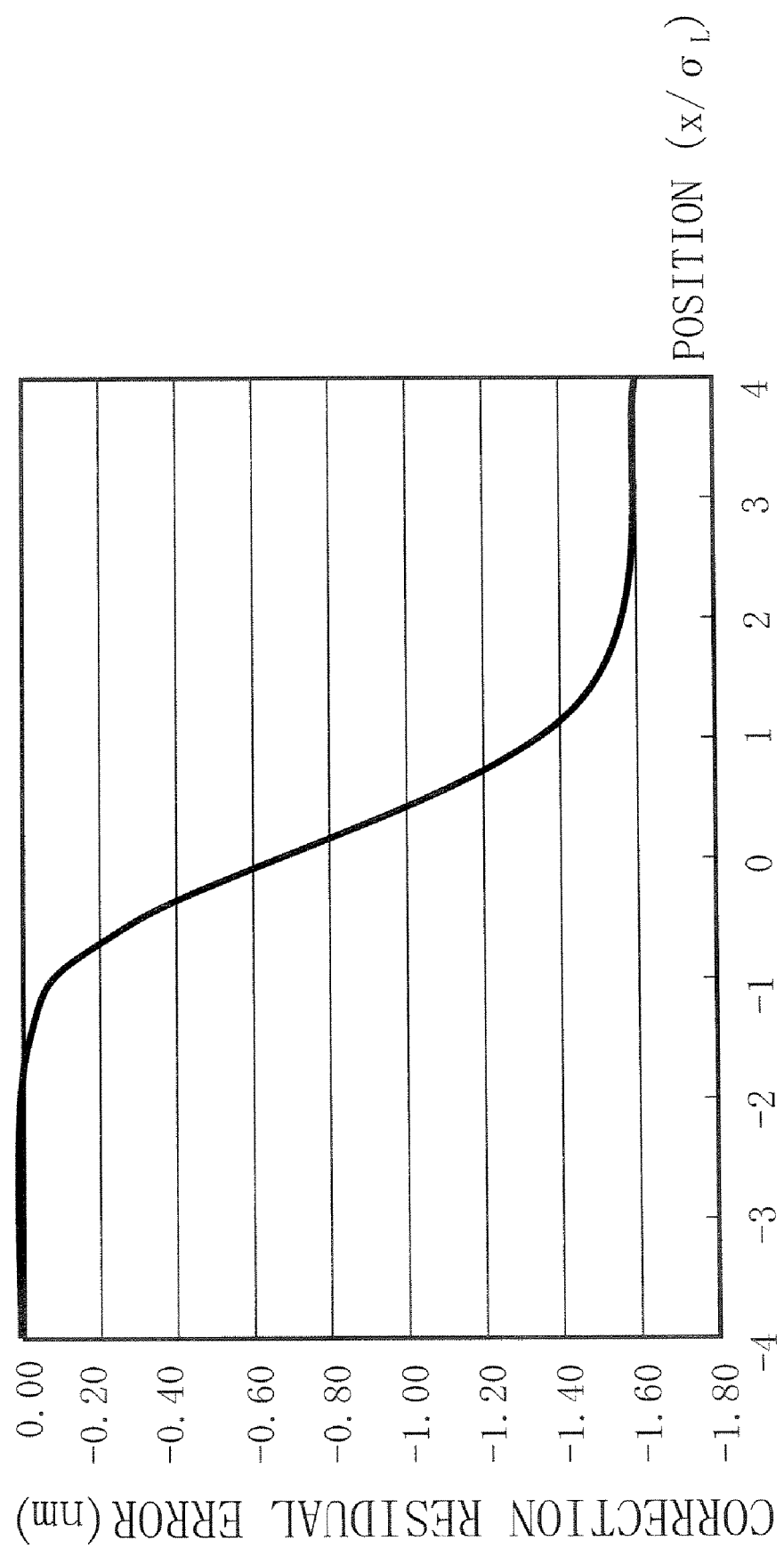
FIG. 9 is a graph showing an example of a correction accuracy obtained when only an area is considered.

FIG. 9 is a graph showing an example of correction accuracy obtained in consideration of only an area. In this case, as an example, only an area of a pattern is considered, and contributions of sides and apexes are ignored. As shown in FIG. 9, it is understood that a large correction residual is left depending on a position since the contributions of the sides and the apexes are ignored.

Figure 10:
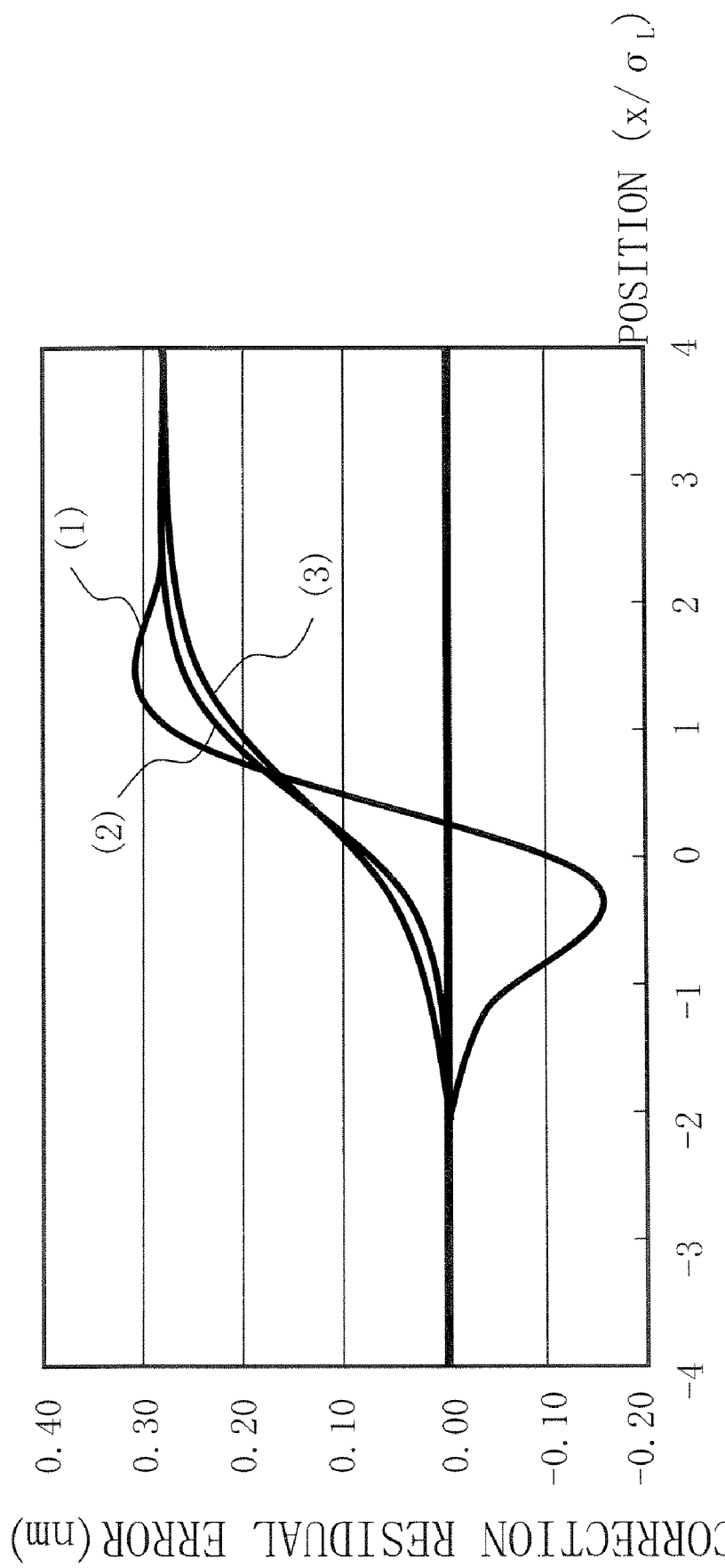
FIG. 10 is a graph showing an example of a correction accuracy obtained when solutions are calculated in cases 1 and 2 according to the second embodiment.

FIG. 10 is a graph showing an example of correction accuracy obtained when solutions are obtained in cases 1 and 2 in the second embodiment. A number in parentheses means the number of times of calculation. A graph shown by (1) indicates the result of the case in which a solution is obtained in case 1. In this case, a correction residual becomes small when the number of times of calculation is increased from 1 to 2. More specifically, accuracy obtained when a solution is found in case 2 is higher than that obtained when a solution is found in case 1. However, even though the number of times of calculation is set at 3 or more, the accuracy can not be improved. This is because contributions of apexes are ignored.

Figure 11:
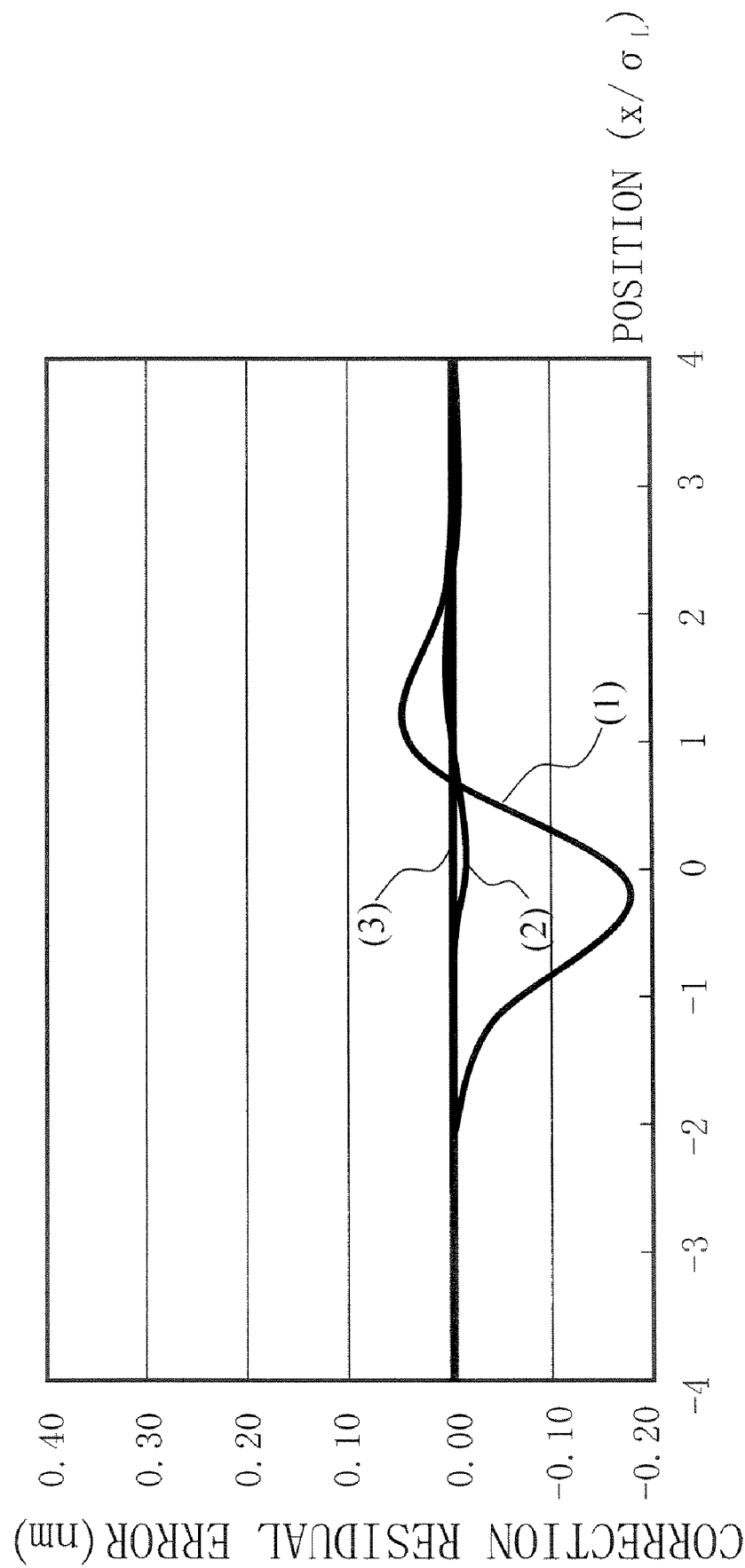
FIG. 11 is a graph showing an example of a correction accuracy obtained when a solution is found in case 3 according to the second embodiment.

FIG. 11 is a graph showing an example of correction accuracy when a solution is found in case 3 in the second embodiment. A number in parentheses means the number of times of calculation. In this case, contributions of sides and apexes are considered. An increase in number of times of calculation can suppress a correction residual to 0.1 nm or less. A case in which loading effects generated in etching of a mask is corrected will be considered below. According to ITRS2005, dimension uniformities (dense patterns) required for an HP45-nm-generation mask and an HP32-nm-generation mask are 3.8 nm and 2.7 nm, respectively. Considering that a large number of error factors generated in manufacture of a mask are present, a result of the above estimation and a prediction of ITRS are compared with each other. Then, it is found that sufficient accuracy cannot be obtained by only a method considering only an area in the near future. In contrast to this, accuracy for a future LSI can be obtained according to the solutions obtained in cases 1 to 3. In particular, as in case 3, correction can be corrected at high accuracy according to correction also considering contribution of sides and contribution of apexes.

Third Embodiment

The second embodiment explains the case using an amount of pattern dimension correction $\Delta l(x, y)$ at which a an amount of variation in pattern dimension $L(x, y)$ obtained by conventional loading effects without considering a correction residual is modulated by using a total sum $l_{lum}$ of sides of patterns included in each mesh region. In the third embodiment, furthermore, in order to improve accuracy, a method of performing iterative calculation by using the amount of pattern dimension correction $\Delta l(x, y)$ calculated in the second embodiment will be described below. Unless otherwise noted, reference symbols and reference numerals are the same as those in the second embodiment. Also in the third embodiment, as shown in FIG. 3, a target object is virtually divided into mesh regions to obtain a model as in the third embodiment.

In the case where $\Delta(x, y)=0$ is not satisfied when an amount of pattern dimension correction $\Delta l(x, y)$ calculated in the second embodiment and obtained when the number of times of iterative calculation, i.e., n=0 is assigned to the equation (13), the value of $\Delta(x, y)$ is expressed by $\Delta_0(x, y)$. An amount of pattern dimension correction $\Delta l(x, y)$ obtained when the number of times of iterative calculation (first amount of pattern dimension correction) is n=0 is expressed by $\Delta l_0(x, y)$. $\Delta l_1(x,y)=\Delta l_0(x,y)-\Delta_0(x,y)$ is calculated. $\Delta l_1(x,y)$ is replaced with the amount of pattern dimension correction $\Delta l(x, y)$ in the equation (13) to calculate the equation (13) again (the number of times of iterative calculation n=1). In the case where $\Delta_1(x, y)=0$ is not satisfied when the calculated value $\Delta(x, y)$ is set as $\Delta_1(x, y)$, $\Delta l_2(x, y)=\Delta_0(x, y)-\Delta A_1(x, y)$ is calculated. $\Delta l_2(x, y)$ is replaced with $\Delta l(x, y)$ in the equation (13) to the calculate equation (13) again (the number of times of iterative calculation n=2). The above calculations are repeated to make it possible a dimension error $\Delta n(x, y)$ to approximate to 0. In this case, the next iterative calculation is performed depending on whether or not $\Delta_n(x, y)=0$ is satisfied. However, even though the value is not 0, the calculation may be performed until $\Delta_n(x, y)$ is smaller than a desired dimension error $\Delta$. In this manner, a correction error can be decreased (reduced). The number of times of iterative calculation n may be appropriately set depending on the above-mentioned necessary accuracy or necessary calculation time.

As described above, on the basis of the amount of pattern dimension correction $\Delta l_0(x, y)$ (first amount of pattern dimension correction) obtained when the number of times of iterative calculation n=0, the dimension $CD_0$ of a design pattern is changed into the dimension $CD_d$ in advance by $\Delta l_n(x, y)$ (second amount of pattern dimension correction) (n>0) iteratively calculated until the pattern dimension error $\Delta_n(x, y)$ falls within the predetermined range $\Delta$. By using an existing writing apparatus, a pattern is written to obtain the dimension $CD_d$ of the writing pattern 14 the dimension of which is previously changed such that the dimension falls within the predetermined range $\Delta$. In this manner, the dimension $CD_f$ of the pattern completed through the loading effects can be made a value the dimension error of which is reduced or eliminated. Therefore, the dimension $CD_f$ can be obtained as designed.

Fourth Embodiment

In the explained configurations of the embodiments described above, before writing is performed by an electron beam writing apparatus, the pattern dimension $CD_0$ of the design pattern 12 is corrected into the pattern dimension $CD_d$ in advance to perform writing with a reduced correction residual. However, the method of reducing a correction residual is not limited to the above method. In a fourth embodiment, in place of execution of correction performed in such a manner that the pattern dimension $CD_0$ of the design pattern 12 is changed into the pattern dimension $CD_d$ to perform writing with a reduced correction residual, a dose of an electron beam used when a pattern is written by an electron beam writing apparatus is controlled. A method of reducing a correction residual by this manner will be described below. Unless otherwise noted, the reference numerals and the reference symbols are the same as those in the first to third embodiments. Also in the fourth embodiment, as shown in FIG. 3, a target object is virtually divided into mesh regions as shown in FIG. 3 as in the first embodiment.

Figure 12:
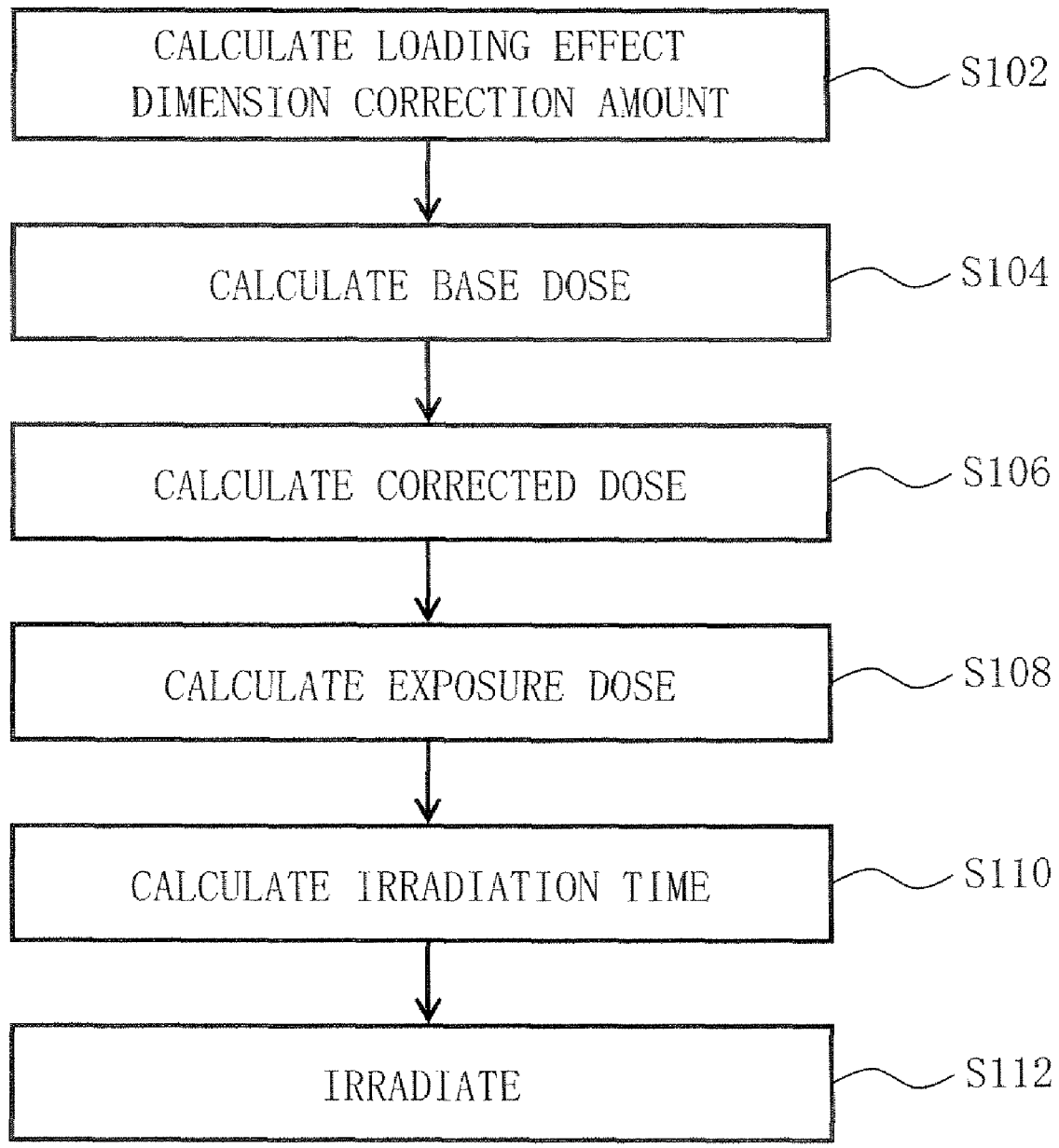
FIG. 12 shows a main part of a flow chart in a writing method according to a fourth embodiment.

FIG. 12 shows a main part of a flow chart of a writing method in the fourth embodiment.

In FIG. 12, an electron beam writing method executes, as steps of one example, a loading effect dimension correction amount calculating step (S102) in which a loading effect residual is corrected, a base dose calculating step (S104) of calculating a base dose of the beam for correcting the loading effect dimension correction amount, a corrected dose calculating step (S106) of calculating a proximity effect corrected-dose obtained in consideration of a dose corresponding to the loading effect dimension correction, a dose calculating step (S108) of calculating a dose, a beam irradiation time calculating step (S110), and an irradiating step (S112).

Figure 13:
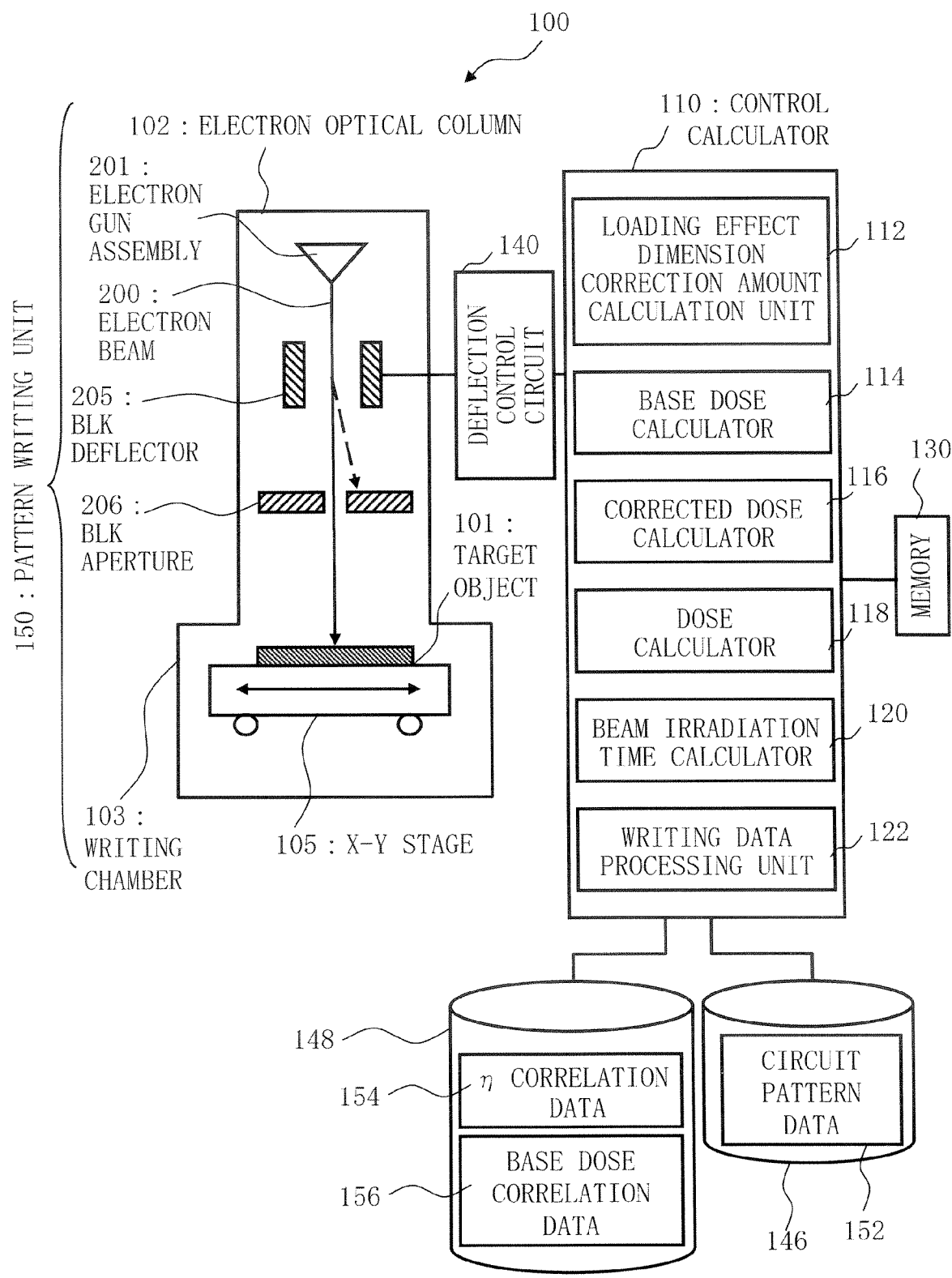
FIG. 13 is a conceptual diagram showing an example of a main configuration of a writing apparatus according to the fourth embodiment.

FIG. 13 is a conceptual diagram showing an example of a main configuration of the writing apparatus according to the fourth embodiment.

In FIG. 13, a writing apparatus 100 is an example of a charged particle beam writing apparatus and serves as an example of an electron beam writing apparatus. The writing apparatus 100 writes or "draw" a pattern onto a target object 101. The target object 101 includes a mask. The writing apparatus 100 includes a pattern writing unit 150 and a control system. As the pattern writing unit 150, an electron optical column 102, or "an electron lens barrel 102" and a writing chamber 103 are included. The writing apparatus 100 includes, as the control system, a control calculator 110, a memory 130 serving as an example of a data storing device, a magnetic disk drive 146 serving as an example of the data storing device, a magnetic disk drive 148 serving as an example of the data storing device, and a deflection control circuit 140. Arranged in the electron optical column 102 are an electron gun assembly 201, a blanking (BLK) deflector 205, and a blanking (BLK) aperture 206. An X-Y stage 105 is arranged in the writing chamber 103. The target object 101 is placed on the X-Y stage 105. The control calculator 110 has functions such as a loading effect dimension correction amount calculator 112, a base dose calculator 114, a corrected dose calculator 116, a dose calculator 118, a beam irradiation time calculator 120, and a writing data processing unit 122. Pattern data 152 stored in the magnetic disk drive 146 is input to the control calculator 110 through the magnetic disk drive 146. Similarly, proximity effect correction coefficient η correlation data 154 and base dose correlation data 156 of each mesh region stored in the magnetic disk drive 148 are input to the control calculator 110 through the magnetic disk drive 148. Information to be input to the control calculator 110, information in arithmetic processing, and processed information are stored in the memory 130 in each case.

The memory 130, the deflection control circuit 140, the magnetic disk drive 146, and the magnetic disk drive 148 are connected to the control calculator 110 through a bus (not shown). The deflection control circuit 140 is connected to the BLK deflector 205.

In FIG. 13, constituent parts required to explain the fourth embodiment are described. The writing apparatus 100 generally includes other configurations required for the writing apparatus 100 as a matter of course. In the description in FIG. 12, the control calculator 110 serving as an example of a computer executes processes of the respective functions such as the loading effect dimension correction amount calculating unit 112, the base dose calculator 114, the corrected dose calculator 116, the dose calculator 118, the beam irradiation time calculator 120, and the writing data processing unit 122. However, the invention is not limited to the configuration. For example, the processes of the functions may be executed by hardware realized by an electric circuit. Alternatively, the processes may be executed by a combination between hardware and software realized by an electric circuit. Furthermore, the processes may be executed by a combination of the hardware and firmware.

An electron beam 200 serving as an example of a charged particle beam emitted from the electron gun assembly 201 and controlled at a predetermined current density J is irradiated on a desired position of the target object 101 on the X-Y stage 105. The X-Y stage 105 is movably arranged. In this case, the electron beam 200 on the target object 101 is blanked as described below when it is irradiation time at which the electron beam having a desired dose is irradiated on the target object 101. More specifically, in order to prevent the electron beam 200 from being excessively irradiated on the target object 101, the electron beam 200 is deflected by, for example, an electrostatic BLK deflector 205, and the electron beam 200 is cut by the BLK aperture 206. Consequently, the electron beam 200 is prevented from reaching the surface of the target object 101. A deflection voltage of the BLK deflector 205 is controlled by the deflection control circuit 140 and an amplifier (not shown).

In a beam-on (blanking-off) state, the electron beam 200 emitted from the electron gun assembly 201 travels along a path indicated by a solid line in FIG. 1. In a beam-off (blanking-on) state, on the other hand, the electron beam 200 emitted from the electron gun assembly 201 travels along a path indicated by a dotted line in FIG. 1. The insides of the electron optical column 102 and the writing chamber 103 in which the X-Y stage 105 is arranged are exhausted by a vacuum pump (not shown), and a vacuum atmosphere having a pressure lower than the atmospheric pressure is obtained.

In FIG. 13, constituent parts required to explain the first embodiment are described. The writing apparatus 100 includes, in addition to the configuration described above, an illumination lens, a first aperture, a projection lens, a shaping deflector, a second aperture, an objective lens, an objective deflector, and the like arranged in the electron optical column 102. In a beam-on (blanking-off) state, the electron beam 200 emitted from the electron gun assembly 201 entirely illuminates an entire first aperture having a square, for example, rectangular opening through an illumination lens in the configuration. In this case, the electron beam 200 is shaped in a square, for example, rectangular shape. The electron beam 200 of a first aperture image having passed through the first aperture is projected on a second aperture by a projection lens. A position of the first aperture image on the second aperture is controlled by a shaping deflector. As a result, the beam shape and the beam shape can be changed. The electron beam 200 of the second aperture image having passed through the second aperture is focused by an objective lens. The electron beam 200 is deflected by an objective deflector and irradiated on a desired position of the target object 101 on the X-Y stage 105. With the configuration, a variable-shaped (VSB type) EB writing apparatus can be obtained.

In this case, a dose D(x, y) of the electron beam 200 when a pattern is written by the writing apparatus 100 can be expressed by the following equation (52).

$$D(x, y) = \text{BaseDose} \times D_p(x, y) \tag{52}$$

A base dose of the beam is represented by "BaseDose", and a proximity effect-corrected dose is represented by "$D_p(x, y)$". The D(x, y) of the electron beam 200 can be calculated by a product between the base dose of the beam and a corrected dose. In this case, as the corrected dose, a proximity effect-corrected dose $D_p(x, y)$ corresponding to an amount of proximity effect correction is used. In the fourth embodiment, an amount of global CD correction such as loading effect correction is achieved by correcting the value of the base dose of the beam.

In this case, a correlative CD (η, BaseDose) between a proximity effect correction coefficient and a base dose of the beam with respect to a standard proximity effect correction coefficient $η_0$, a standard base dose $\text{BaseDose}_0$, a range of influence $σ_B$, and a corrected line width dimension CD is derived.

Figure 14:
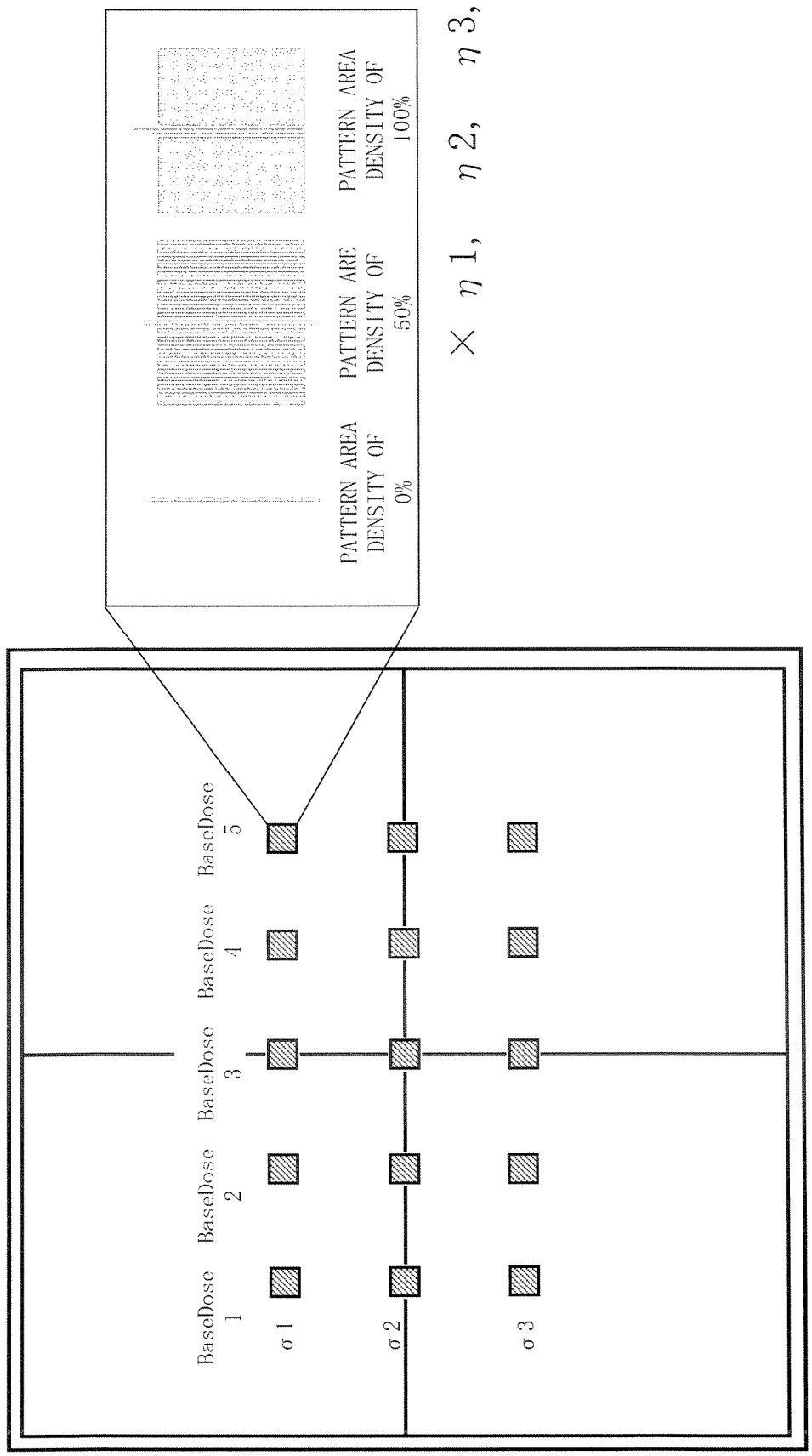
FIG. 14 is a diagram for explaining an example of a method to derive a correlative CD ($\eta$, BaseDose) between proximity effect correction coefficients and base doses of the beam with respect to a correction line width dimension CD according to the fourth embodiment.

FIG. 14 shows an example of a method of deriving the correlative CD (η, BaseDose) between the proximity effect correction coefficients and the base doses of the beam with respect to the corrected line width dimension CD in the fourth embodiment.

As shown in FIG. 14, a pattern set is arranged which is obtained by combining a line pattern having a pattern area density of almost 0%, a line pattern having an area density of 50%, and a line pattern having an area density of 100%, each line pattern having a line width serving as an example. A pattern is written on a mask while changing the values of the proximity effect correction coefficients, the base doses of the beam, and the range of influence. The line widths of the line patterns having the pattern area densities of 0%, 50% and 100% are measured.

Figure 15A:
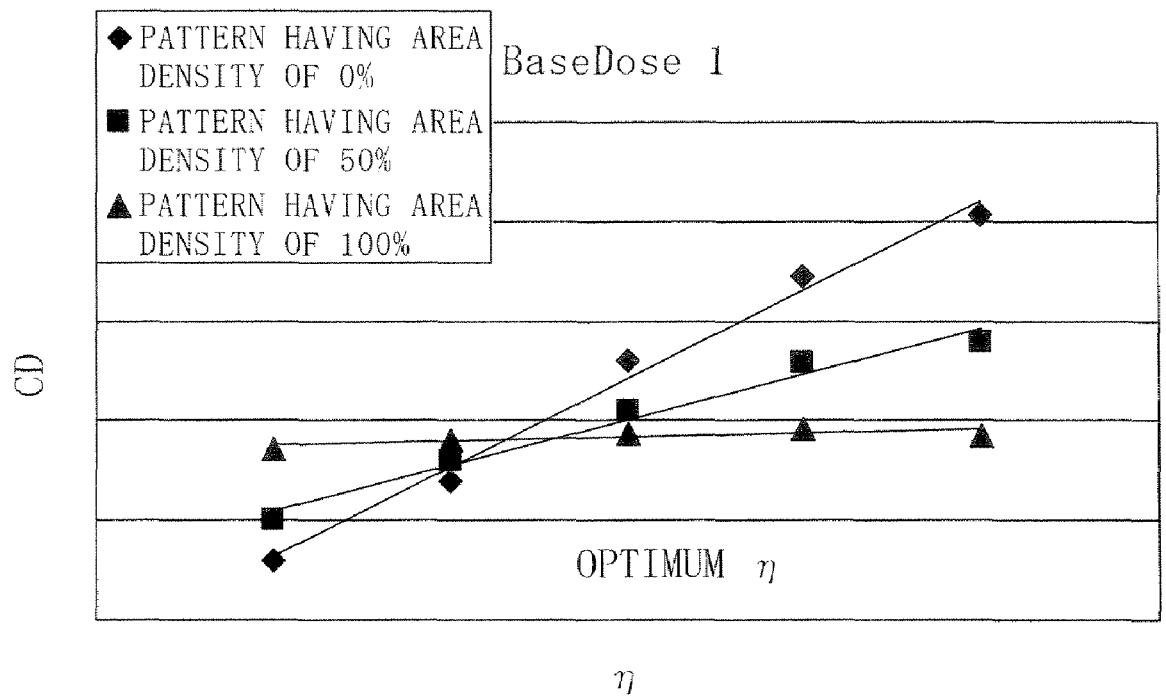
FIGS. 15A and 15B are graphs of line widths with respect to proximity effect correction coefficients at the base dose of the beam in the fourth embodiment.
Figure 15B:
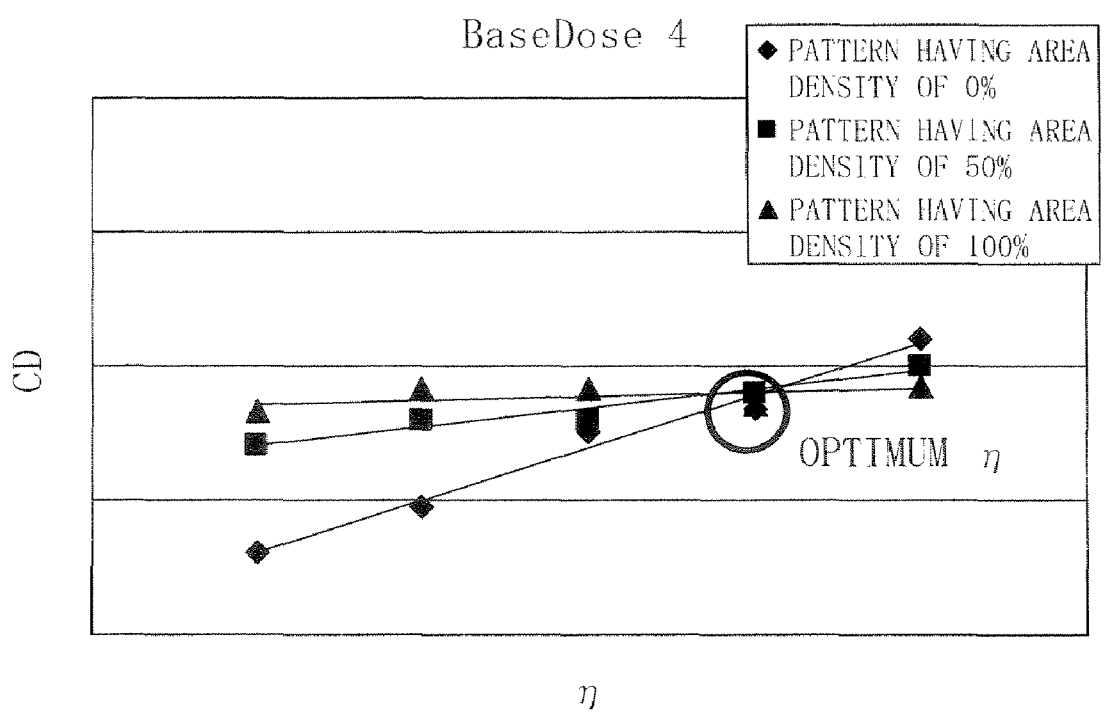

FIGS. 15A and 15B each show an example in which line widths to the proximity effect correction coefficient are plotted on a graph at base doses of the beam in the fourth embodiment. A proximity effect correction coefficient at which differences among the line widths of the line patterns having the pattern area densities of 0%, 50%, and 100% at the base doses of the beam are minimum is determined together with an combination of an optimum proximity effect correction coefficient and a base dose of the beam which satisfies a proximity effect correction condition. In the examples shown in FIGS. 15A and 15B, five combinations of optimum proximity effect correction coefficients and base doses of the beam can be calculated for each range of influence. A range of influence at which differences among the line widths of the line patterns having the pattern area densities of 0%, 50%, and 100% are minimum is determined as an optimum range of influence $\sigma_B$.

On the basis of the optimum proximity effect correction coefficient, the base dose of the beam, the range of influence $\sigma_B$, and the five combinations of line widths obtained at this time, the optimum proximity effect correction coefficient, the base dose of the beam, and the line width are continuously correlated to each other by interpolation. Of the proximity effect correction coefficients and the base doses of the beam on the correlative continuous line to line widths, a combination between a proximity effect correction coefficient and a base dose of the beam which coincides with iso-focul dose on a line pattern having an area density of 50% and a line width of 1 to 1 is defined as the standard proximity effect correction coefficient $\eta_0$ and the standard base dose of the beam.

Figure 16:
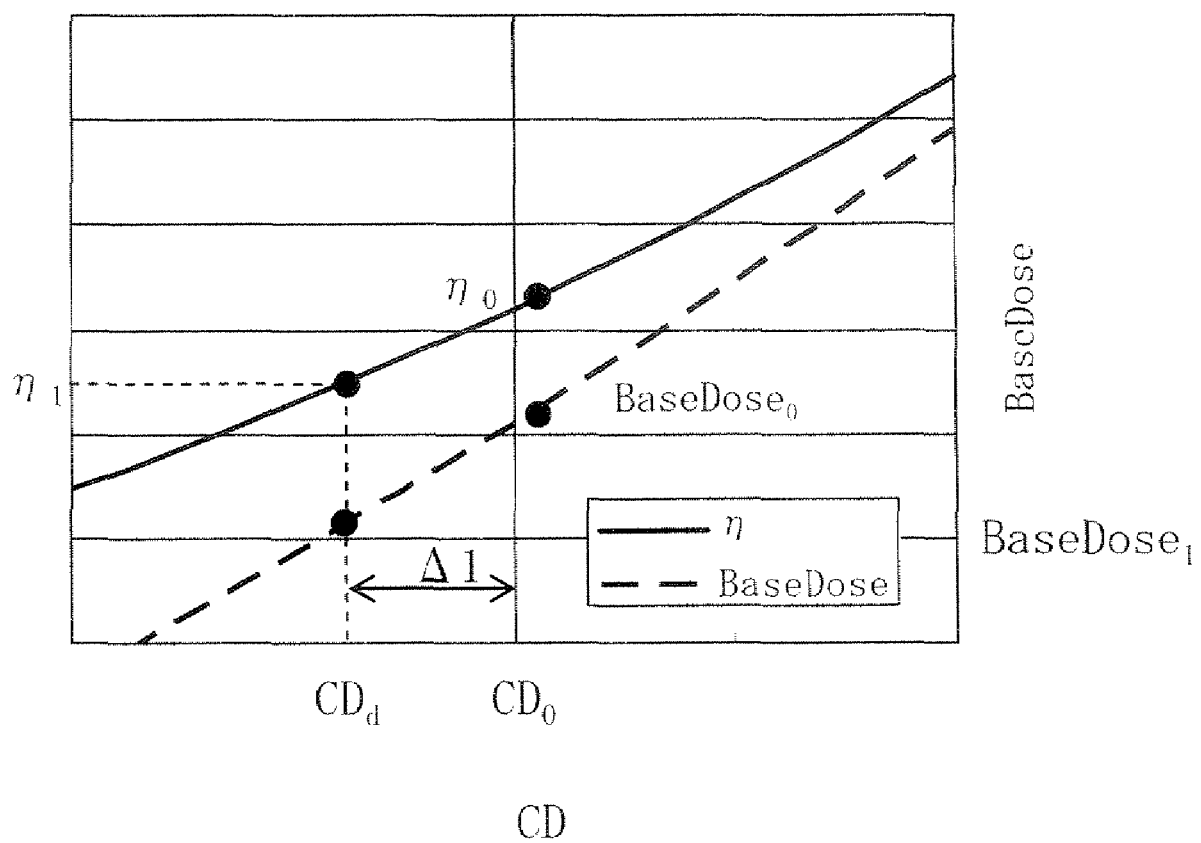
FIG. 16 is a graph showing a change of a line width CD, i.e., a correlative CD ($\eta$, BaseDose) of a correction line width dimension when proximity effect correction coefficients and base doses of the beam are changed along a correlative continuous line subjected to interpolation on the basis of combinations between optimum proximity effect correction coefficients and base doses of the beam about the standard proximity effect correction coefficient $\eta_0$, the standard base dose $BaseDose_0$ of the beam, and a line width obtained at this time in the fourth embodiment.
Figure 17:
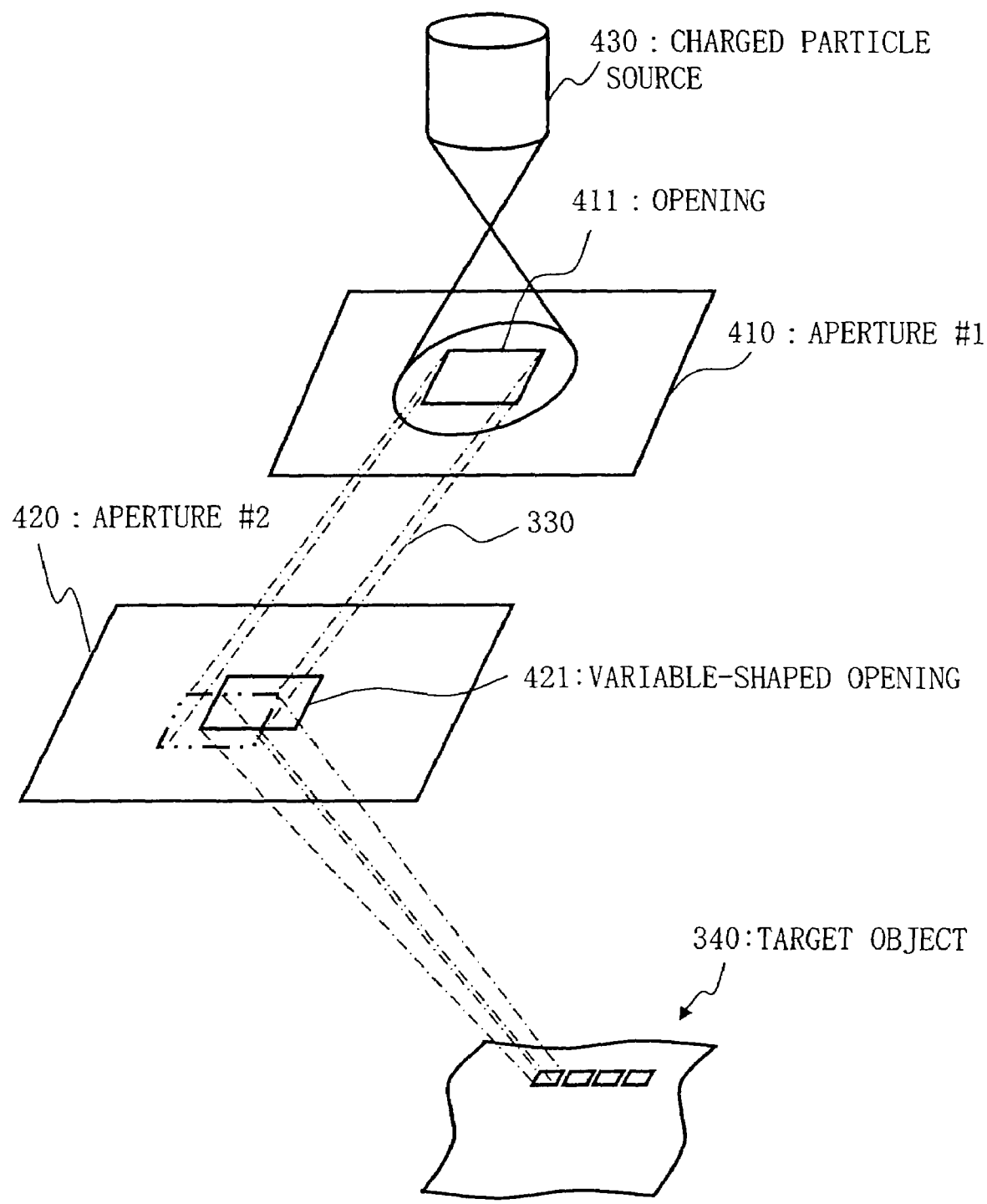
FIG. 17 is a conceptual diagram for explaining an operation of a conventional variable-shaped electron beam photolithography apparatus.
Figure 18:
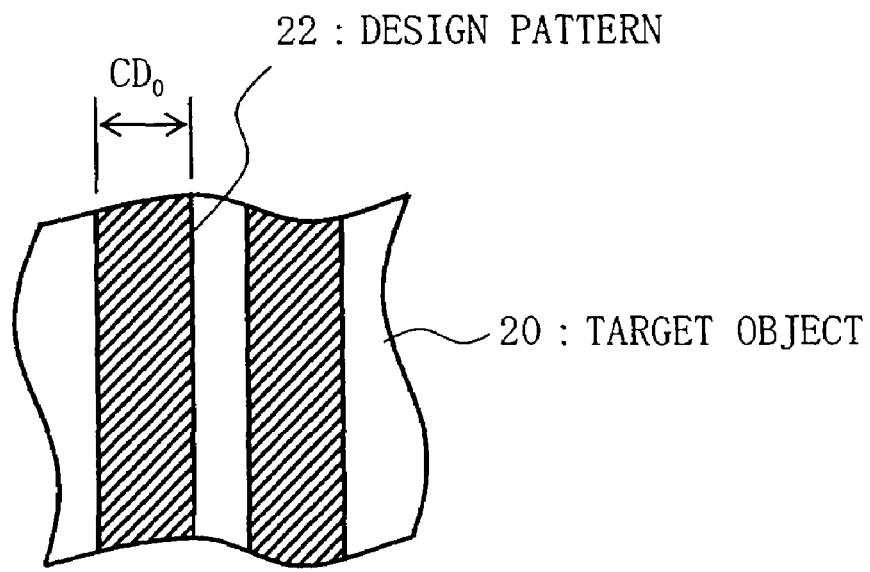
FIG. 18 is a diagram showing an example of a design pattern.
Figure 19:
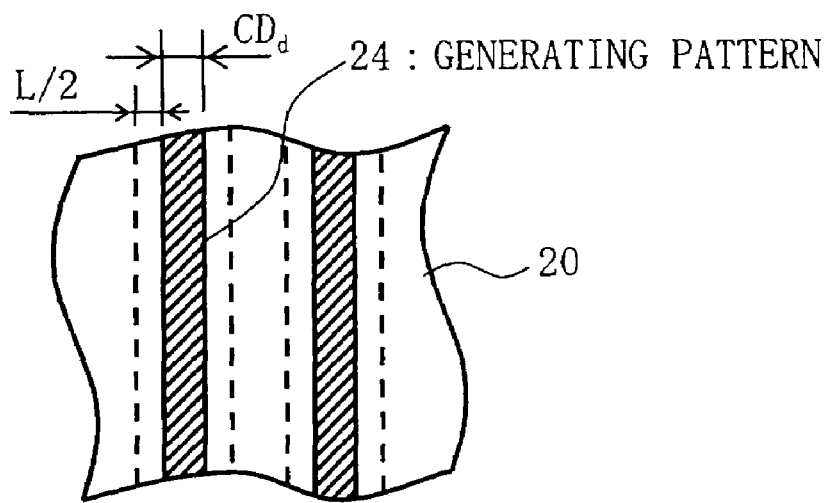
FIG. 19 is a diagram showing an example of a writing pattern obtained when the design pattern in FIG. 18 is written.
Figure 20:
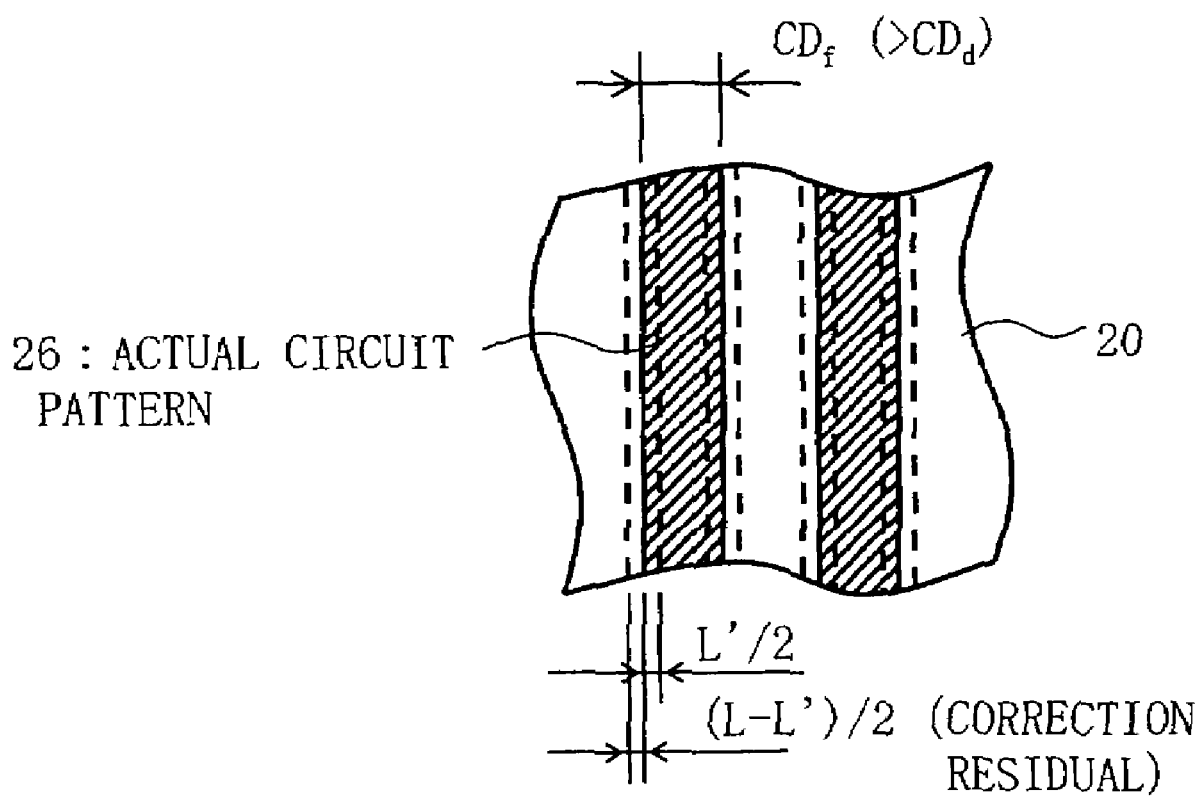
FIG. 20 is a conceptual diagram for explaining a line width of an actually completed pattern after etching when writing is performed at the dimension in FIG. 19.

FIG. 16 is a graph showing a change of a line width CD, i.e., a correlative CD ($\eta$, BaseDose) of a correction line width dimension when a proximity effect correction coefficient and base doses of the beam are changed along a correlative continuous line subjected to interpolation on the basis of five combinations between optimum proximity effect correction coefficients and base doses of the beam about the standard proximity effect correction coefficient $\eta_0$, the standard base dose BaseDose$_0$ of the beam, and a line width obtained at this time in the fourth embodiment. According to the correlation, the line width dimensions can be changed in a state in which the proximity effect correction condition is satisfied.

In this case, when the dimension CD$_0$ of the design pattern 12 is desired to be changed by the amount of pattern dimension correction $\Delta l(x, y)$, calculated in each of the embodiments, for loading effect correction the correction residual of which is reduced, it is understood that, on the basis of the correlation data shown in FIG. 16, the standard base dose BaseDose$_0$ of the beam may be corrected to a base dose BaseDose$_1$ of the beam, and the standard proximity effect correction coefficient $\eta_0$ may be corrected to a proximity effect correction coefficient $\eta_1$. In this case, the amount of pattern dimension correction $\Delta l(x, y)$ for loading effect correction the correction residual of which is reduced in the embodiment is defined by a CD error $L_n(x, y)$ falling within a desired range $\Delta$ in the first embodiment. Furthermore, in the second embodiment, the amount of pattern dimension correction $\Delta l(x, y)$ is defined by $\Delta l(x, y)$. In the third embodiment, the amount of pattern dimension correction $\Delta l(x, y)$ is defined by $\Delta l_n(x, y)$ falling within the desired range $\Delta$. In the fourth embodiment, all the amounts of pattern dimension correction are described as $\Delta l(x, y)$. By using the above relationship, a configuration will be described below in which, in place of a change of the dimension CD$_0$ of the design pattern to the dimension CD$_d$ by adding or subtracting the amount of pattern dimension correction $\Delta l(x, y)$ in advance before writing, the amount of pattern dimension correction $\Delta l(x, y)$ is corrected by a exposure dose of the electron beam 200.

The control calculator 110 receives the pattern data 152 through the magnetic disk drive 146. The writing data processing unit 122 forms shot data on the basis of the pattern data 152. Beam irradiation time T of each shot is calculated, and the electron beam 200 is irradiated according to the beam irradiation time T, so that a pattern is written on the target object 101.

In step S120, as a loading effect dimension correction amount calculating step, the loading effect dimension correction amount calculating unit 112 calculates an amount of pattern dimension correction $\Delta l(x, y)$ for loading effect correction the correction residual of which is reduced. Since the calculating method is described in the above embodiments, a description thereof will be omitted.

In the fourth embodiment, the amount of pattern dimension correction $\Delta l(x, y)$ is calculated by the control calculator 110. However, the amount of pattern dimension correction $\Delta l(x, y)$ is calculated in advance by a device other than the control calculator 110, and the control calculator 110 preferably receives the amount of pattern dimension correction $\Delta l(x, y)$. For example, data of the amount of pattern dimension correction $\Delta l(x, y)$ is stored in the magnetic disk drive 148 or the like, the data of the amount of pattern dimension correction $\Delta l(x, y)$ stored in the magnetic disk drive 148 is input to the control calculator 110 through the magnetic disk drive 148. For example, a map of the amount of pattern dimension correction $\Delta l(x, y)$ for each mesh region is preferably formed and stored in the magnetic disk drive 148 or the like in advance. In this manner, the probability that a writing operation is stopped due to waiting for calculation of the amount of pattern dimension correction $\Delta l(x, y)$ can be eliminated.

In S104, as a base dose calculating step, the base dose calculator 114 calculates the base dose of the beam subjected to loading effect residual correction. The base dose calculator 114 receives the base dose BaseDose correlation data 156 from which the correlation shown in FIG. 16 can be acquired through the magnetic disk drive 148. The base dose calculator 114 calculates the corresponding base dose BaseDose$_1$ of the beam from the data of the amount of pattern dimension correction $\Delta l(x, y)$. In this manner, it is possible to obtain the base dose BaseDose$_1$ of the beam for each mesh region obtained in consideration of an amount of loading effect dimension correction the correction residual of which is reduced.

In this case, in the fourth embodiment, the base dose BaseDose$_1$ of the beam is calculated by the control calculator 110. However, the base dose BaseDose$_1$ is not necessarily calculated by the control calculator 110. As described above, when the amount of pattern dimension correction $\Delta l(x, y)$ is calculated by a device other than the control calculator 110 in advance, the base dose BaseDose$_1$ of the beam is also calculated by a device other than the control calculator 110. A base dose map having values for respective mesh regions is prepared. The map is also preferably stored in the magnetic disk drive 148 or the like. The control calculator 110 receives the corresponding base dose BaseDose$_1$ of the beam through the magnetic disk drive 148 from the base dose map stored in the magnetic disk drive 148. Consequently, calculation time can be reduced.

In S160, as a corrected dose calculating step, the corrected dose calculator 116 calculates a proximity effect-corrected dose $D_p(x, y)$. First, the corrected dose calculator 116 receives the proximity effect correction coefficient $\eta$ correlation data 154 from which the correlation shown in FIG. 16 can be acquired through the magnetic disk drive 148. Then, the corresponding proximity effect correction coefficient $\eta_1$ is obtained from the data of the amount of pattern dimension correction $\Delta l(x, y)$. In this manner, it is possible to obtain a proximity effect correction coefficient $\eta_1$ for each proximity effect correction mesh region (to be described later) obtained in consideration of an amount of loading effect dimension correction the correction residual of which is reduced. The proximity effect-corrected dose $D_p(x, y)$ can be expressed by the following equation (53-1) to equation (53-5).

$$D_P(x, y) = \sum_{i=0} D_P^i(x, y) \qquad (53\text{-}1)$$

$$= D_P^0(x, y) + D_P^1(x, y) + D_P^2(x, y) + \ldots$$

$$D_P^0(x, y) = \frac{\frac{1}{2}\eta}{\frac{1}{2} + \eta \cdot v(x, y)} \quad (n = 0) \qquad (53\text{-}2)$$

$$D_P^i(x, y) = \frac{\eta \cdot D_P^0(x, y)}{\frac{1}{2} + \eta}[D_P^{i-1}(x, y)U(x, y) - V(x, y)] \qquad (53\text{-}3)$$

$$(n \geq 1)$$

$$U(x, y) = \int_{pattern}\int \kappa_p(x - x', y - y')dx'dy' \qquad (53\text{-}4)$$

$$V(x, y) = \int_{pattern}\int D_p^{i-1}(x', y')\kappa_p(x - x', y - y')dx'dy' \qquad (53\text{-}5)$$

Reference symbol i a degree of a correction term. A distribution function of a proximity effect is represented by "$\kappa_p(x, y)$". A range of influence of the proximity effect is narrower than the range of influence of loading effects. For this reason, when a pattern forming region is divided into mesh regions (proximity effect correction mesh regions), calculation is performed such that the size of the mesh region is considered to be smaller than a mesh size (1 mm) for loading effect correction. For example, the size may be in a micrometer order, i.e., 1 μm. The calculation is performed such that the value η defined by the equation (53-1) and equation (53-2) is considered as $\eta_1$ obtained from the proximity effect correction coefficient η correlation data 154. In this manner, it is possible to calculate a proximity effect-corrected dose $D_p(x, y)$ obtained in consideration of an amount of loading effect dimension correction the correction residual of which is reduced.

In the fourth embodiment, the proximity effect correction coefficient $\eta_1$ is calculated by the control calculator 110. However, the proximity effect correction coefficient $\eta_1$ is not necessarily calculated by the control calculator 110. As described above, when the amount of pattern dimension correction Δl(x, y) is calculated by a device other than the control calculator 110 in advance, the proximity effect correction coefficient $\eta_1$ is also calculated by a device other than the control calculator 110 in advance. A proximity effect correction coefficient η map having values for respective mesh regions is prepared. The map is also preferably stored in the magnetic disk drive 148 or the like. The control calculator 110 receives the corresponding proximity effect correction coefficient $\eta_1$ through the magnetic disk drive 148 from the proximity effect correction coefficient η map stored in the magnetic disk drive 148. Consequently, calculation time can be reduced.

In S108, as a dose calculating step, the dose calculator 118 calculates an exposure dose D(x, y) of the electron beam 200 according to the equation (52) by use of the base dose Base-Dose$_1$ and a proximity effect-corrected dose $D_p(x, y)$ obtained in consideration of an amount of loading effect dimension correction the correction residual of which is reduced.

In S110, as an irradiation time calculating step, the beam irradiation time calculator 120 reads the exposure dose D(x, y) from the memory 130 and calculates beam irradiation time T(=dose D(x, y)/(current density J)) by using a current density J.

In S112, as an irradiating step (or a pattern writing step), the control calculator 110 outputs a signal to the deflection control circuit 140 such that beam irradiation onto a target object 101 is turned off in the calculated beam irradiation time T. In the deflection control circuit 140, according to the signal, the BLK deflector 205 is controlled to deflect the electron beam 200 depending on the calculated beam irradiation time T. After the electron beam is irradiated on the target object 101 at the desired exposure dose D(x, y), the electron beam 200 deflected by the BLK deflector 205 is blocked by the blanking aperture 206 not to reach the target object 101. The BLK deflector 205 constitutes the pattern writing unit 150 as described above. In this manner, the pattern writing unit 150 writes a pattern on the target object 101 at the desired exposure dose D(x, y) by using the electron beam 200.

As described above, the dose is corrected to make it possible to perform loading effect correction the correction residual of which is reduced or eliminated in the loading effect correction. As a result, a pattern can be formed on a target object such as a mask at a highly accurate pattern dimension through loading effects.

Processing contents or operation contents of "units" or "steps" described in the above explanation can be constituted by programs which can be operated by a computer. Alternatively, the processing contents or the operation contents may be executed by a combination between hardware and software or executed by a combination between the hardware and firmware. When the contents are constituted by the program, the program is recorded on a recording medium such as a magnetic disk drive, a magnetic tape device, an FD, or a read only memory (ROM). For example, the program is recorded on the magnetic disk drive 146.

In FIG. 13, the control calculator 110 serving as a computer may be connected through a bus (not shown) to a random access memory (RAM) serving as an example of a data storing device, a ROM, a magnetic disk (HD) drive, a keyboard (K/B) serving as an example of an input unit, a mouse, a monitor serving as an example of an output unit, a printer, an external interface (I/F) serving as an example of an input/output unit, an FD, a DVD, a CD, or the like.

The embodiments are described with reference to the concrete examples. However, the present invention is not limited to the concrete examples. For example, an electron beam writing apparatus of a variable-shaped beam type is used in the embodiments. However, the present invention can also be applied to a writing apparatus of another type. The purpose of use of the present invention is not limited to an electron beam writing apparatus. For example, the present invention can be used in not only direct formation of a resist pattern on a mask or a wafer but also formation of a mask for an optical stepper, an X-ray mask, or the like. An amount of pattern dimension correction may be calculated by a calculator or the like in the writing apparatus 100 shown in FIG. 13 to write a pattern in the first to third embodiments. The amount of pattern dimension correction may also be received by the calculator in the writing apparatus 100 to correct writing data. In FIGS. 1, 2, and 5, a square (all angles are 90°) pattern is described as an example. However, the pattern is not limited to the square pattern, and a general two-dimensional pattern such as an oblique line having an arbitrary angle, a triangle, a circle, an oval, or a ring may be used.

Parts such as an apparatus configuration or a control method which are not directly required to explain the present invention are omitted. However, a necessary apparatus configuration and a necessary control method can be appropriately selected to be used. For example, although a control unit configuration for controlling the writing apparatus 100 is omitted, a necessary control unit configuration is appropriately selected to be used, as a matter of course.

All pattern generation methods, all charged particle beam writing apparatuses, all charge particle beam writing methods which include the elements of the present invention and can be appropriately changed in design by those skilled in the art are included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern generation method comprising:
   changing a dimension of a pattern included in each mesh-like region of a plurality of mesh-like regions by using an area of the pattern and a total sum of lengths of circumferential sides of the pattern included in each mesh-like region to correct a dimension error of the pattern, the dimension error being caused by loading effects and the plurality of mesh-like regions being virtually divided from a pattern forming region of a target object; and
   generating a pattern of the dimension changed on the target object,
   wherein at least one of the changing and the generating steps is performed by a control calculator implemented in hardware or in a hardware/software combination.

2. The pattern generation method according to claim 1, further comprising:
   iteratively calculating an amount of pattern dimension correction until the dimension error of the pattern falls within a predetermined range by using the area of the pattern and the total sum of lengths of the circumferential sides of the pattern;
   wherein the change is performed on the basis of the calculated amount of pattern dimension correction.

3. The pattern generation method according to claim 1, further comprising:
   calculating an amount of pattern dimension correction obtained by modulating a variation in pattern dimension generated in the pattern due to loading effects by using the total sum of sides of the pattern;
   wherein the change is performed on the basis of the amount of pattern dimension correction.

4. The pattern generation method according to claim 3, wherein the amount of pattern dimension correction is modulated by using a constant of apex such that an area of apex parts of the pattern is calculated by multiplying the constant by a square of the amount of pattern dimension correction.

5. The pattern generation method according to claim 1, further comprising:
   calculating a first amount of pattern dimension correction obtained by modulating a variation in pattern dimension generated in the pattern due to loading effect by using the total sum of sides of the pattern; and
   iteratively calculating a second amount of pattern dimension correction until the dimension error of the pattern falls within a predetermined range on the basis of the first amount of pattern dimension correction;
   wherein the change is performed on the basis of the second amount of pattern dimension correction.

6. A pattern generation method comprising:
   changing a exposure dose of a charged particle beam by using an area of a pattern included in each mesh-like region of a plurality of mesh-like regions and a total sum of lengths of circumferential sides of the pattern to correct a dimension error of the pattern, wherein the dimension error being caused by loading effects and the plurality of mesh-like regions being virtually divided from a pattern forming region of a target object; and
   irradiating a charged particle beam at the exposure dose changed to form the pattern on the target object.

7. The pattern generation method according to claim 6, further comprising:
   iteratively calculating an amount of pattern dimension correction until the dimension error of the pattern falls within a predetermined range by using the area of the pattern and the total sum of lengths of the circumferential sides of the pattern;
   wherein the change is performed on the basis of the calculated amount of pattern dimension correction.

8. The pattern generation method according to claim 6, further comprising:
   calculating an amount of pattern dimension correction obtained by modulating a variation in pattern dimension generated in the pattern due to loading effects by using the total sum of sides of the pattern;
   wherein the change is performed on the basis of the amount of pattern dimension correction.

9. The pattern generation method according to claim 8, wherein the amount of pattern dimension correction is modulated by using a constant of apex such that an area of apex parts of the pattern is calculated by multiplying the constant by a square of the amount of pattern dimension correction.

10. The pattern generation method according to claim 6, further comprising:
    calculating a first amount of pattern dimension correction obtained by modulating a variation in pattern dimension generated in the pattern due to loading effect by using the total sum of sides of the pattern; and
    iteratively calculating a second amount of pattern dimension correction until the dimension error of the pattern falls within a predetermined range on the basis of the first amount of pattern dimension correction;
    wherein the change is performed on the basis of the second amount of pattern dimension correction.

11. A charged particle beam writing apparatus comprising:
    a correcting unit configured to correct a exposure dose of a charged particle beam by using an area of a pattern included in each mesh-like region of a plurality of mesh-like regions and a total sum of lengths of circumferential sides of the pattern, the plurality of mesh-like regions being virtually divided from a pattern forming region of a target object; and
    a pattern writing unit configured to write the pattern onto the target object by irradiating the charged particle beam at the corrected exposure dose.

* * * * *